(12) United States Patent
Huang et al.

(10) Patent No.: US 12,156,479 B2
(45) Date of Patent: Nov. 26, 2024

(54) MEMORY DEVICE AND MANUFACTURING METHOD THEREOF

(71) Applicant: Taiwan Semiconductor Manufacturing Co., Ltd., Hsinchu (TW)

(72) Inventors: Yen-Lin Huang, Hsinchu (TW); MingYuan Song, Hsinchu (TW); Chien-Min Lee, Hsinchu (TW); Shy-Jay Lin, Jhudong Township (TW); Chi-Feng Pai, New Taipei (TW); Chen-Yu Hu, New Taipei (TW); Chao-Chung Huang, Neipu Township (TW); Kuan-Hao Chen, Caotun Township (TW); Chia-Chin Tsai, Kaohsiung (TW); Yu-Fang Chiu, Taipei (TW); Cheng-Wei Peng, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 389 days.

(21) Appl. No.: 17/518,789

(22) Filed: Nov. 4, 2021

(65) Prior Publication Data
US 2022/0216396 A1  Jul. 7, 2022

Related U.S. Application Data

(60) Provisional application No. 63/137,383, filed on Jan. 14, 2021, provisional application No. 63/133,464, filed on Jan. 4, 2021.

(51) Int. Cl.
*H10N 50/85* (2023.01)
*C22C 5/04* (2006.01)
(Continued)

(52) U.S. Cl.
CPC .............. *H10N 50/85* (2023.02); *C22C 5/04* (2013.01); *H01F 10/325* (2013.01);
(Continued)

(58) Field of Classification Search
None
See application file for complete search history.

(56) References Cited

U.S. PATENT DOCUMENTS 10,333,058 B2   6/2019   Aradhya et al.
10,529,919 B2   1/2020   Cho et al.
(Continued)

FOREIGN PATENT DOCUMENTS

DE   102019125887 A1   7/2020
JP   2019054154 A   4/2019
(Continued)

*Primary Examiner* — Kevin M Bernatz
(74) *Attorney, Agent, or Firm* — Slater Matsil, LLP

(57) ABSTRACT

A memory device and a manufacturing method thereof are provided. The memory device includes a magnetic tunneling junction (MTJ) and a spin Hall electrode (SHE). The MTJ includes a free layer, a reference layer and a barrier layer lying between the free layer and the reference layer. The SHE is in contact with the MTJ, and configured to convert a charge current to a spin current for programming the MTJ. The SHE is formed of an alloy comprising at least one heavy metal element and at least one light transition metal element. The heavy metal element is selected from metal elements with one or more valence electrons filling in 5d orbitals, and the light transition metal element is selected from transition metal elements with one or more valence electrons partially filling in 3d orbitals.

20 Claims, 31 Drawing Sheets

(51) Int. Cl.
  H01F 10/32 (2006.01)
  H10B 61/00 (2023.01)
  H10N 50/10 (2023.01)
  H10N 50/80 (2023.01)
  H10N 52/00 (2023.01)
  H10N 52/01 (2023.01)
  H10N 52/80 (2023.01)

(52) U.S. Cl.
  CPC ....... H01F 10/3254 (2013.01); H01F 10/329 (2013.01); H10B 61/10 (2023.02); H10B 61/22 (2023.02); H10N 50/10 (2023.02); H10N 50/80 (2023.02); H10N 52/00 (2023.02); H10N 52/01 (2023.02); H10N 52/80 (2023.02)

(56) References Cited

U.S. PATENT DOCUMENTS

| | | | |
|---|---|---|---|
| 10,714,678 | B2 | 7/2020 | Park et al. |
| 10,770,117 | B1* | 9/2020 | Takekida ............... H10B 41/27 |
| 10,861,527 | B2* | 12/2020 | Lee ...................... G11C 11/161 |
| 10,957,370 | B1* | 3/2021 | Beery .................. G11C 11/161 |
| 11,296,115 | B1* | 4/2022 | Or-Bach ............... H01L 29/167 |
| 2013/0009123 | A1* | 1/2013 | Tada .................. C23C 16/0272 257/3 |
| 2017/0178705 | A1* | 6/2017 | Buhrman ............... G11C 11/161 |
| 2018/0033954 | A1* | 2/2018 | Aradhya ................. H01F 10/30 |
| 2018/0351085 | A1 | 12/2018 | Shiokawa et al. |
| 2019/0305216 | A1* | 10/2019 | Gosavi .................. H10N 52/00 |
| 2019/0386205 | A1 | 12/2019 | Gosavi et al. |
| 2020/0098407 | A1 | 3/2020 | Tsai et al. |
| 2020/0106002 | A1 | 4/2020 | Song et al. |
| 2020/0135804 | A1* | 4/2020 | Luo ........................ H10N 50/01 |
| 2020/0136022 | A1* | 4/2020 | Lin ........................ H10N 52/01 |
| 2020/0168664 | A1* | 5/2020 | Noh ........................ H10B 61/00 |
| 2020/0185598 | A1* | 6/2020 | Noh ........................ H10N 52/00 |
| 2020/0251527 | A1 | 8/2020 | Shin et al. |
| 2020/0295033 | A1* | 9/2020 | Sakamoto ............. H10B 41/27 |
| 2020/0312908 | A1* | 10/2020 | Oguz .................... H10N 52/01 |
| 2020/0365308 | A1* | 11/2020 | Lin ..................... H01F 10/3254 |
| 2020/0365653 | A1 | 11/2020 | Tsai et al. |
| 2021/0134339 | A1* | 5/2021 | Song ..................... H10N 50/85 |
| 2023/0082665 | A1* | 3/2023 | Yoshikawa ........... H10B 61/10 257/421 |

FOREIGN PATENT DOCUMENTS

| | | |
|---|---|---|
| KR | 20160031832 A | 3/2016 |
| KR | 20200034930 A | 4/2020 |
| KR | 20200133182 A | 11/2020 |
| WO | 2019125384 A1 | 6/2019 |

* cited by examiner

MEMORY DEVICE AND MANUFACTURING METHOD THEREOF

PRIORITY CLAIM

This application claims the benefit of U.S. Provisional Application No. 63/137,383 filed on Jan. 14, 2021 and U.S. Provisional Application No. 63/133,464, filed on Jan. 4, 2021, each application is hereby incorporated by reference.

BACKGROUND

Magnetic random access memory (MRAM) is one of the leading candidates for next-generation memory technologies that aim to surpass the performance of various existing memories. MRAM offers comparable performance to volatile static random access memory (SRAM) and comparable density with lower power consumption to volatile dynamic random access memory (DRAM). As compared to non-volatile flash memory, MRAM offers much faster access speed and suffers minimal degradation over time. Spin orbit torque MRAM (SOT-MRAM) is a type of MRAM. As compared to spin transfer torque MRAM (STT-MRAM), which is another type of MRAM, SOT-MRAM offers better performance in terms of speed and endurance. Nevertheless, further reducing switching energy of SOT-MRAM is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
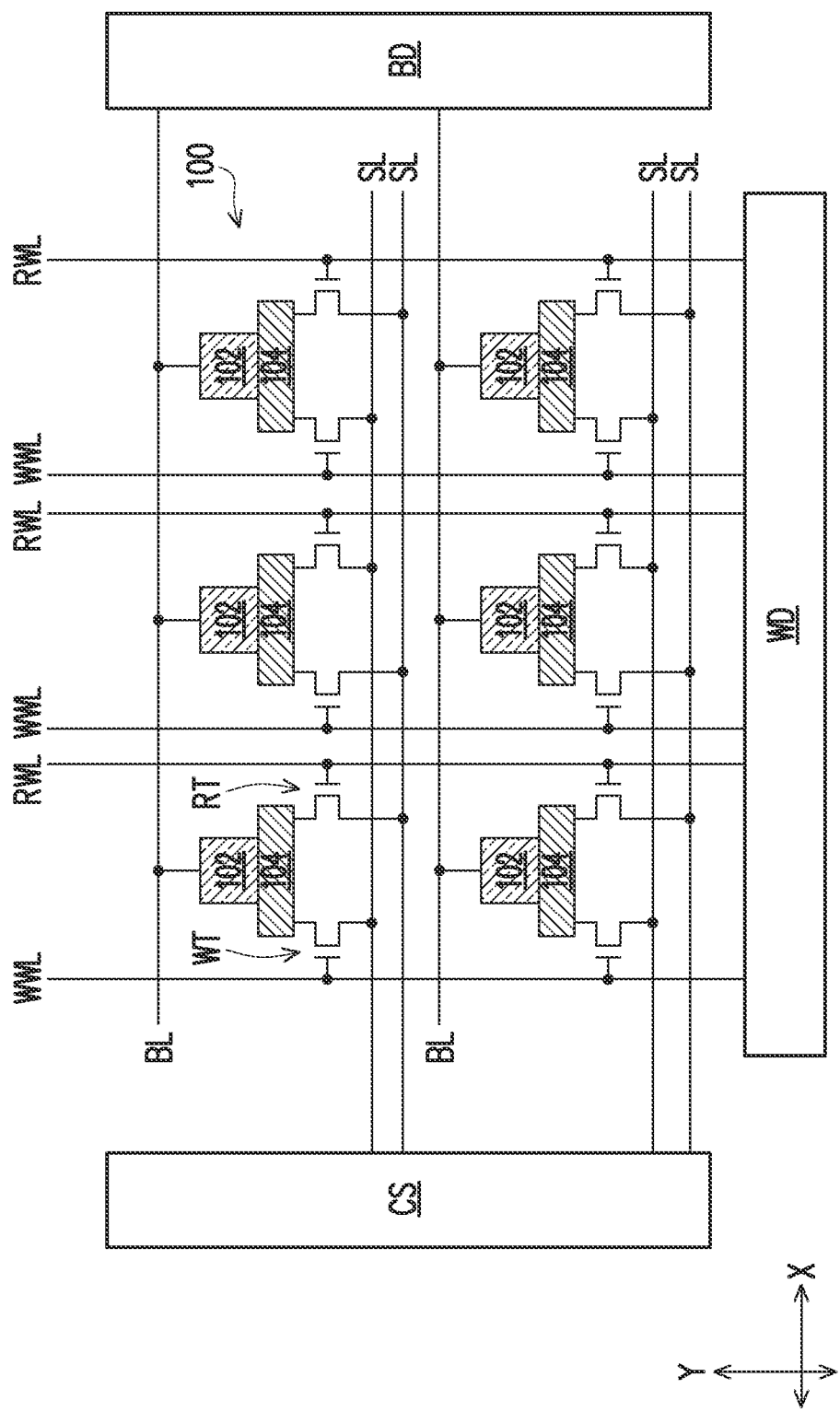
FIG. 1A is a circuit diagram schematically illustrating a memory array according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
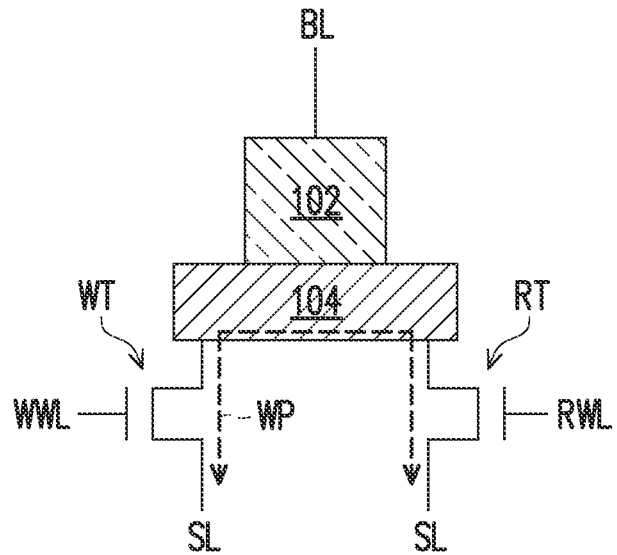
FIG. 1B illustrates a write path in a selected unit cell in the memory array as shown in FIG. 1A.
Figure 1C:
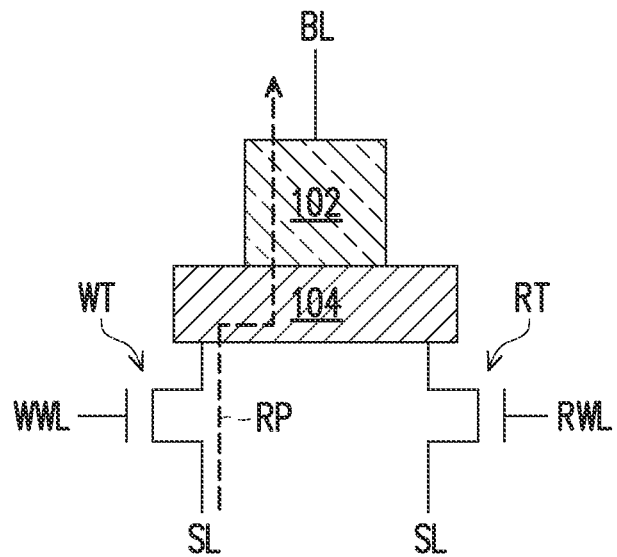
FIG. 1C illustrates a read path in a selected unit cell in the memory array as shown in FIG. 1A.

FIG. 1A is a circuit diagram schematically illustrating a memory array 10 according to some embodiments of the present disclosure. FIG. 1B illustrates a write path in a selected unit cell 100 in the memory array 10 as shown in FIG. 1A. FIG. 1C illustrates a read path in a selected unit cell 100 in the memory array 10 as shown in FIG. 1A.

Referring to FIG. 1A, the memory array 10 is a magnetic random access memory (MRAM) array. The memory array 10 includes a plurality of the unit cells 100 arranged along rows and columns. The unit cells 100 in each row may be arranged along a direction X, while the unit cells 100 in each column may be arranged along a direction Y. In some embodiments, each column of the unit cells 100 are coupled to a pair of a write word line WWL and a read word line RWL, and each row of the unit cells 100 is coupled to a bit line BL as well as a pair of source lines SL. In these embodiments, each unit cell 100 may be defined between one of the write word lines WWL and one of the read word lines RWL, and between one of the bit lines BL and two of the source lines SL. In addition, the write word lines WWL and the read word lines RWL may extend along the direction Y, and the bit lines BL as well as the source lines SL may extend along the direction X.

Each unit cell 100 includes a magnetic tunneling junction (MTJ) 102 as a storage element. Magnetization orientations of ferromagnetic layers in the MTJ 102 may determine an electrical resistance of the MTJ 102. The MTJ 102 may have a low electrical resistance state when the magnetization orientations are at a parallel state, and have a high electrical resistance state when the magnetization orientations are at an anti-parallel state. By altering the magnetization orientations in the MTJ 102, the MTJ 102 can be programmed to store complementary logic sates (e.g., a logic high state indicating the high electrical resistance state and a logic low state indicating the low electrical resistance state). Further, according to embodiments of the present disclosure, the MTJ 102 is configured to be programmed by utilizing a spin Hall effect, and the memory array 10 may be referred as a spin orbit torque MRAM (SOT-MRAM) array. A spin hall electrode (SHE) 104, or referred as a spin orbit torque (SOT) layer, lies below each of the MTJs 102. During a programming operation, an in-plane charge current passing through the SHE 104 may be converted to a perpendicular spin current via a spin Hall effect. The perpendicular spin current then flows into a ferromagnetic layer in the MTJ 102 and switch its magnetization via a spin orbit torque (SOT). In this way, the magnetization orientations of the MTJ 102 (i.e., the electrical resistance of the MTJ 102) can be altered, and bit data can be programmed into the MTJ 102. During a read operation, the resistance state of the MTJ 102 can be sensed, and the bit data stored in the MTJ 102 can be read out.

An energy efficiency of the programming operation is highly dependent on a spin Hall conductivity of the SHE 104. The higher the spin Hall conductivity of the SHE 104, the less power consumption is required for the programming operation. The spin Hall conductivity of the SHE 104 is defined as a ratio of a spin Hall angle of the SHE 104 over an electrical resistivity of the SHE 104. The spin Hall angle of the SHE 104 indicates an efficiency of the conversion from the in-plane charge current provided across the SHE 104, to the perpendicular spin current induced due to the spin Hall effect, and is defined as a ratio of the induced perpendicular spin current over the corresponding in-plane charge current. In other words, the higher the spin Hall angle, the more efficient of the conversion from the in-plane charge current to the perpendicular spin current, and the higher of the spin Hall conductivity. On the other hand, a shunting ratio of the in-plane charge current is affected by the electrical resistivity of the SHE 104. The shunting ratio is defined as a ratio of a sheet resistance of the SHE 104 over a sheet resistance of a free layer in the MTJ 102. When the electrical resistivity of the SHE 104 is relatively high, a larger portion of the in-plane charge current may take a low resistance path through the MTJ 102 standing on the SHE 104, and such portion of the in-plane charge current may not contribute to the generation of the perpendicular spin current. As a result, the conversion from the in-plane charge current to the perpendicular spin current is less efficient. On the other hand, when the electrical resistivity of the SHE 104 is relatively low, a shunting ratio of the in-plane charge current becomes lower, and the conversion from the in-plane charge current to the perpendicular spin current is more efficient. Therefore, in order to improve the spin Hall conductivity of the SHE 104, the spin Hall angle of the SHE 104 has to be high, and/or the electrical resistivity of the SHE 104 has to be low.

According to embodiments of the present disclosure, the SHE 104 is formed of a metal alloy including at least one heavy metal element and at least one light transition metal element, and exhibits superior spin Hall conductivity over other materials for forming a SHE. The heavy metal element may be a metal element with valence electron(s) filling in 5d orbitals, or referred as a 5d metal element. For instance, the at least one heavy metal element may include platinum (Pt), palladium (Pd) or a combination thereof. On the other hand, the light transition metal element may be a transition metal element with valence electron(s) partially filling in 3d orbitals. For instance, the at least one light transition metal element may include scandium (Sc), titanium (Ti), vanadium (V), chromium (Cr), manganese (Mn), iron (Fe), cobalt (Co), nickel (Ni), copper (Cu) or combinations thereof. Such superior spin Hall conductivity of the SHE 104 may result from, e.g., the heavy metal element possessing 5d electron bands, which contribute to a strong spin-orbit coupling and result in an effective magnetic field to separate spin-up and down current. In addition, the 3d electrons of the light transition metal element might contribute to the electron scattering center, which results in higher spin Hall angle. There may be other explanations for the superior spin Hall conductivity of the SHE, the present disclosure is not limited to the explanations discussed above. For instance, as another possible explanation, such metal alloy has superior spin Hall conductivity because a 3d-5d hybridization can reduce spin memory loss (or referred as diminish of spin polarization) and spin current back flow.

As an example, the SHE 104 may be formed of a platinum-chromium alloy, which can be presented as $Pt_xCr_{1-x}$. A spin Hall angle of the platinum-chromium alloy appears to be raised by increasing chromium content in the platinum-chromium alloy (i.e., reducing platinum content in the platinum-chromium alloy). In addition, an electrical resistivity of the platinum-chromium alloy appears to be reduced by increasing platinum content in the platinum-chromium alloy (i.e., reducing chromium content in the platinum-chromium alloy). An optimum range of the "x" in the $Pt_xCr_{1-x}$ may be from about 0.5 to about 0.8. If the "x" is less than about 0.5, the electrical resistivity of the platinum-chromium alloy may be significantly compromised. On the other hand, if the "x" is greater than about 0.8, the spin Hall angle of the platinum-chromium alloy may be limited. The spin Hall angle of the platinum-chromium alloy with the optimum x range may be equal to or greater than 0.1, such as ranging from 0.1 to 1.1. The electrical resistivity of the platinum-chromium alloy with the optimum x range may be equal to or lower than 600 μΩ·cm, such as ranging from 30 μΩ·cm to 600 μΩ·cm. Accordingly, the spin Hall conductivity of the platinum-chromium alloy with the optimum x range may be equal to or greater than $$3 \times 10^5 \left(\frac{\hbar}{2e}\right) \Omega^{-1} \cdot m^{-1},$$

such as ranging from $$3 \times 10^5 \left(\frac{\hbar}{2e}\right) \Omega^{-1} \cdot m^{-1} \text{ to } 10 \times 10^5 \left(\frac{\hbar}{2e}\right) \Omega^{-1} \cdot m^{-1}.$$

As a result of the superior spin Hall conductivity, requirement of the in-plane charge current for switching the magnetization orientations in the MTJ 102 can be significantly lowered. For instance, the in-plane charge current requirement of the unit cell 100 including the SHE 104 formed of the platinum-chromium alloy with the optimum x range may be between $1\times10^6$ A·cm$^{-2}$ and $30\times10^6$ A·cm$^{-2}$. As a result of such low requirement of the in-plane charge current, the unit cell 100 including the SHE 104 formed of the platinum-chromium alloy with the optimum x range requires much less energy for switching the magnetization orientations in the MTJ 102 (or referred as a switching energy). For instance, switching energy requirement of the unit cell 100 including the SHE 104 formed of the platinum-chromium alloy with the optimum x range may be between about 0.1 fJ and 1 fJ. Furthermore, as a result of low electrical resistivity of the platinum-chromium alloy with the optimum x range, the shunting ratio of the unit cell 100 including the SHE 104 formed of the platinum-chromium alloy with the optimum x range may be effectively lowered. For instance, the shunting ratio of the unit cell 100 including the SHE 104 formed of the platinum-chromium alloy with the optimum x range may be between 0.1 and 0.9.

As another example, the SHE 104 may be formed of a platinum-vanadium alloy, which can be presented as $Pt_yV_{1-y}$. Similarly, a spin Hall angle of the platinum-vanadium alloy appears to be raised by increasing vanadium content in the platinum-vanadium alloy (i.e., reducing platinum content in the platinum-vanadium alloy), and an electrical resistivity of the platinum-vanadium alloy appears to be reduced by increasing platinum content in the platinum-vanadium alloy (i.e., reducing vanadium content in the platinum-vanadium alloy). An optimum range of the "y" in the $Pt_yV_{1-y}$ may be from about 0.7 to about 0.9. If the "y" is less than about 0.7, the electrical resistivity of the platinum-vanadium alloy may be significantly compromised. On the other hand, if the "y" is greater than about 0.9, the spin Hall angle of the platinum-vanadium alloy may be limited. The spin Hall angle of the platinum-vanadium alloy with the optimum y range may be equal to or greater than 0.1, such as ranging from 0.1 to 0.8. The electrical resistivity of the platinum-vanadium alloy with the optimum y range may be equal to or lower than 135 µΩ·cm, such as ranging from 30 µΩ·cm to 135 µΩ·cm. Accordingly, the spin Hall conductivity of the platinum-vanadium alloy with the optimum y range may be equal to or greater than $$3\times10^5\left(\frac{\hbar}{2e}\right)\Omega^{-1}\cdot m^{-1},$$

such as ranging from $$3\times10^5\left(\frac{\hbar}{2e}\right)\Omega^{-1}\cdot m^{-1} \text{ to } 10\times10^5\left(\frac{\hbar}{2e}\right)\Omega^{-1}\cdot m^{-1}.$$

As a result of the superior spin Hall conductivity, the in-plane charge current requirement of the unit cell 100 including the SHE 104 formed of the platinum-vanadium alloy with the optimum y range may be between $1\times10^6$ A·cm$^{-2}$ and $30\times10^6$ A·cm$^{-2}$. As a result of such low requirement of the in-plane charge current, the switching energy requirement of the unit cell 100 including the SHE 104 formed of the platinum-vanadium alloy with the optimum y range may be between 0.1 fJ and 1 fJ. Furthermore, as a result of low electrical resistivity of the platinum-vanadium alloy with the optimum y range, the shunting ratio of the unit cell 100 including the SHE 104 formed of the platinum-vanadium alloy with the optimum y range may be between 0.04 and 0.18.

Furthermore, more combinations of the heavy metal element and the light transition metal element (e.g., Sc, Ti, V, Cr, Mn, Fe, Co, Ni, Co, Zn) may fall within the scope of the present disclosure. The present disclosure is not limited to the above-described two examples. In addition, in some embodiments, a thickness of the SHE 104 ranges from about 0.5 nm to about 10 nm. The spin Hall angle of the SHE 104 may increase as the thickness of the SHE 104, and may not saturate until the thickness of the SHE 104 is equal to or greater than about 0.5 nm. Therefore, if the thickness of the SHE 104 is below about 0.5 nm, the spin Hall angle of the SHE 104 may be limited. On the other hand, if the thickness of the SHE 104 is greater than about 10 nm, requirement of the charge current for a programming operation is significantly increased, thus energy efficiency of the programming operation is compromised.

As shown in FIG. 1A, in some embodiments, each unit cell 100 further includes a write transistor WT and a read transistor RT. The write transistor WT and the read transistor RT in each unit cell 100 are coupled to the SHE 104. Particularly, the write transistor WT and the read transistor RT may be coupled to portions of the SHE 104 at opposite sides of the MTJ 102, such that the MTJ 102 can stand on a write current path (i.e., the in-plane charge current described above) between the write transistor WT and the read transistor RT. Accordingly, the MTJ 102 can be programmed by the write current. The write transistors WT and the read transistors RT may respectively be a three-terminal device. A gate terminal of each write transistor WT may be coupled to one of the write word lines WWL, and a gate terminal of each read transistor RT may be coupled to one of the read word lines RWL. In addition, the write transistor WT and the read transistor RT in each unit cell 100 are respectively coupled to the SHE 104 through a source/drain terminal, and respectively coupled to one of the source lines SL through the other source/drain terminal. In some embodiments, the write transistor WT and the read transistor RT in each unit cell 100 are coupled to two of the source lines SL. Further, a terminal of each MTJ 102 is coupled to the underlying SHE 104, and the other terminal of each MTJ 102 is coupled to one of the bit lines BL.

A word line driver circuit WD may be coupled to the write word lines WWL and the read word lines RWL, and configured to control switching of the write transistors WT and the read transistors RT through the write word lines WWL and the read word lines RWL. In addition, a current source circuit CS may be coupled to the source lines SL. The current source circuit CS is configured to provide the write current (i.e., the in-plane charge current described above) for programming the MTJs 102 as well as a read current for sensing the resistance states of the MTJs 102, and may be in conjunction with the word line driver circuit WD. Further, a bit line driver circuit BD may be coupled to the bit lines BL, and configured to sense the read current passing through the MTJs 102, so as to identify the resistance states of the MTJs 102.

Referring to FIG. 1A and FIG. 1B, during a programming operation, the write transistor WT and the read transistor RT of a selected unit cell 100 may be both turned on, and a write current WP (i.e., the in-plane charge current as described above) may flow through the write transistor WT, the read transistor RT and the SHE 104 in between. As a result of spin orbit interaction, the write current WP flowing through the SHE 104 may induce a SOT on the MTJ 102, thus the MTJ 102 can be subjected to programming. The write transistor WT and the read transistor RT are turned on by setting the corresponding write word line WWL and read word line RWL, and the write current WP is provided by setting a voltage difference between the corresponding two of the source lines SL. On the other hand, the bit line BL may be floated.

Referring to FIG. 1A and FIG. 1C, during a read operation, the read transistor RT of a selected unit cell 100 is turned on while the write transistor WT in the same unit cell 100 may be kept off. A voltage difference may be set between the bit line BL and the source line SL coupled to the read transistor RT, thus a read current RP can flow through the MTJ 102 connected between the read transistor RT and the bit line BL. Due to a spin orbit coupling effect, different magnetization orientations of the MTJ 102 (i.e., the parallel state and the anti-parallel state) may result a change in an amount of scattering of conduction electrons traveling across the MTJ 102. Such change leads to difference electrical resistances of the MTJ 102, and may affect a value of the read current RP or a value of a voltage drop across the MTJ 102. Therefore, the bit data (i.e., the resistance state) stored in the MTJ 102 can be read out. On the other hand, the source line SL coupled to the write transistor WT may be floated.

Figure 2:
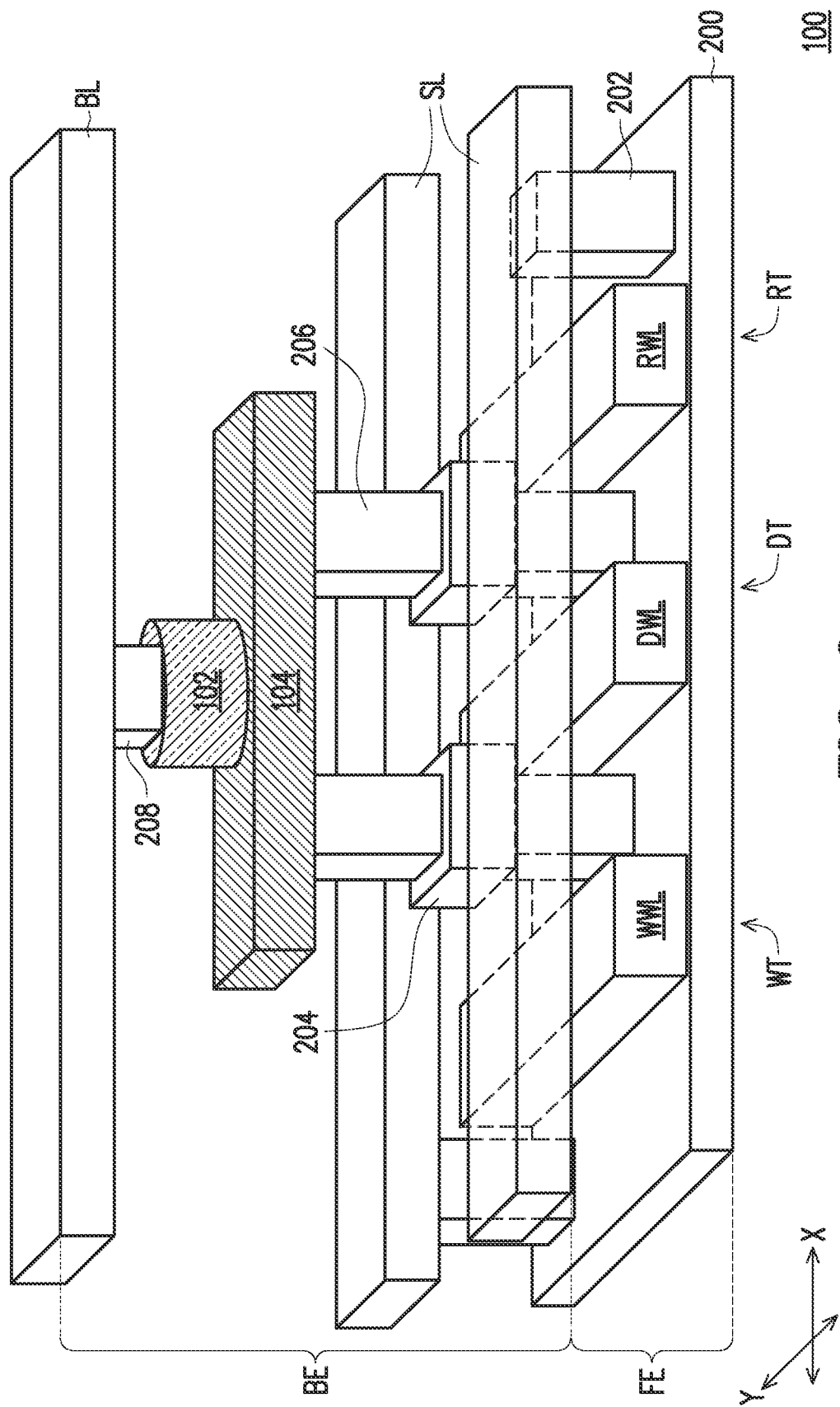
FIG. 2 is a schematic three-dimensional view illustrating one of the unit cells shown in FIG. 1A.

FIG. 2 is a schematic three-dimensional view illustrating one of the unit cells 100 shown in FIG. 1A.

Referring to FIG. 2, the write transistor WT and the read transistor RT in a unit cell 100 are formed in a front-end-of-line (FEOL) structure FE of a device wafer. A gate terminal of the write transistor WT may be provided by a write word line WWL lying on a semiconductor substrate 200. Similarly, a gate terminal of the read transistor RT may be provided by a read word line RWL lying on the semiconductor substrate 200. The write word line WWL and the read word line RWL may be laterally spaced apart from each other, and may both extend along the direction Y. Source and drain terminals (not shown) of the write transistor WT are located at opposite sides of the write word line WWL, and source and drain terminals (not shown) of the read transistor RT are located at opposite sides of the read word line RWL. In those embodiments where the write transistor WT and the read transistor RT are planar-type transistors, the write word line WWL as well as the read word line RWL respectively lie on a planar surface of the substrate 200, and the source and drain terminals of the write transistor WT and the read transistor RT may be doped regions or epitaxial structures (not shown) formed in a shallow region of the semiconductor substrate 200. In those embodiments where the write transistor WT and the read transistor RT are fin-type transistors, the write word line WWL and the read word line RWL respectively cover and intersect with a fin structure at a top region of the substrate 200, and the source and drain terminals of the write transistor WT and the read transistor RT may be epitaxial structures (not shown) in contact (e.g., in lateral contact) with the fin structures. In those embodiments where the write transistor WT and the read transistor RT are gate-all-around (GAA) transistors, stacks of semiconductor sheets over the substrate 200 are respectively wrapped by a write word line WWL or a read word line RWL, and the source and drain terminals of the write transistor WT and the read transistor RT may be epitaxial structures (not shown) in contact (e.g., in lateral contact) with the stacks of semiconductor sheets. Furthermore, contact plugs 202 may stand on the source/drain terminals of the write transistor WT and the read transistor RT. The contact plugs 202 are electrically connected to these source/drain terminals, in order connect these source/drain terminals to overlying conductive components.

In some embodiments, a dummy word line DWL lies between the write word line WWL and the read word line RWL. The dummy word line DWL, the write word line WWL and the read word line RWL may extend along the same direction, such as the direction Y. By disposing the dummy word line DWL, a parasitic transistor may be formed between the write transistor WT and the read transistor RT. The parasitic transistor may be structurally identical with the write transistor WT and the read transistor RT. A gate terminal of the parasitic transistor may be provided by the dummy word line DWL. The write transistor WT and the read transistor RT each share one of its source/drain terminals with the parasitic transistor. In some embodiments, the dummy word line DWL is configured to receive a gate voltage that can ensure an off state of the parasitic transistor, thus the interference between the write transistor WT and the read transistor RT can be effectively avoided. Accordingly, the parasitic transistor including the dummy word line DWL may also be referred as an isolation transistor DT.

The source lines SL, the SHE 104, the MTJ 102 and the bit line BL may be integrated in a back-end-of-line (BEOL) structure BE formed above the FEOL structure FE. In some embodiments, the source lines SL coupled to the write transistor WT and the read transistor RT are portions of a bottom metallization layer in the BEOL structure BE, and may extend along the direction X. The source lines SL are connected to some of the source/drain terminals of the write transistor WT and the read transistors RT through the contact plugs 202 extending in between. In some embodiments, others source/drain terminals of the write transistor WT and the read transistor RT are connected to landing pads 204 also formed in the bottom metallization layer of the BEOL structure BE, by the contact plugs 202 extending in between. Moreover, the SHE 104 and the MTJ 102 may be formed over the bottom metallization layer. The SHE 104 may be electrically connected to the landing pads 204 in the bottom metallization layer by bottom vias 206 extending in between. In other words, the SHE 104 may be coupled to source or drain terminals of the write transistor WT and the read transistor RT through the underlying bottom vias 206, landing pads 204 and contact plugs 202. The MTJ 102 stands on the SHE 104, and may be located between the bottom vias 206, so as to be standing on a path of the write current flowing between the bottom vias 206. Further, the bit line BL may be formed in another metallization layer over the MTJ 102, and may extend along the direction X. In some embodiments, the bit line BL is electrically connected to the MTJ 102 through a top via 208.

FIG. 3A through FIG. 3D are schematic cross-sectional views respectively illustrating a MTJ standing on a SHE, according to some embodiments of the present disclosure.

Figure 3A:
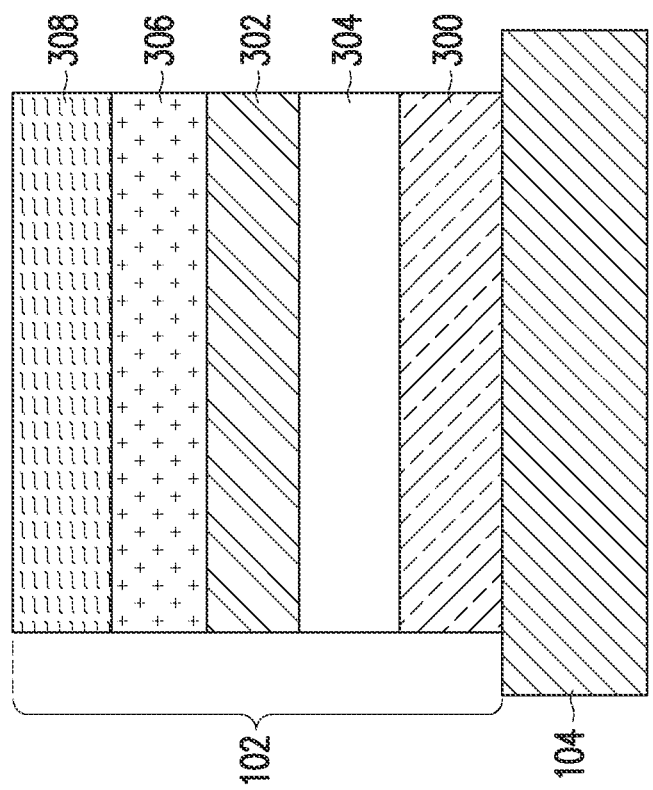
FIG. 3A through FIG. 3D are schematic cross-sectional views respectively illustrating a MTJ standing on a SHE, according to some embodiments of the present disclosure.

Referring to FIG. 3A, the MTJ 102 standing on the SHE 104 may be a multilayer structure, and at least includes a free layer 300, a reference layer 302 and a barrier layer 304 sandwiched between the free layer 300 and the reference layer 302. In some embodiments, the free layer 300 and the reference layer 302 respectively include at least one ferromagnetic layer, while the barrier layer 304 includes at least one insulating layer. A magnetization direction of the reference layer 302 is pinned, and a magnetization direction of the free layer 300 can be altered by, for example, the spin Hall effect as described above. When the magnetization directions of the free layer 300 and the reference layer 302 are in the parallel state, the MTJ 102 is in the low electrical resistance state. On the other hand, when the magnetization directions of the free layer 300 and the reference layer 302 are in the anti-parallel state, the MTJ 102 is in the high electrical resistance state. In addition, the insulating barrier layer 304 provides isolation between the free layer 300 and the reference layer 302, while being thin enough to be tunneled through by the read current. In some embodiments, the free layer 300 is formed of a cobalt-iron-boron (CoFeB) alloy, a cobalt-palladium (CoPd) alloy, a cobalt-iron (CoFe) alloy, a cobalt-iron-boron-tungsten (CoFeBW) alloy, a nickel-iron (NiFe) alloy, ruthenium, the like or combinations thereof. In some embodiments, the reference layer 302 is formed of the CoFeB alloy. Moreover, in some embodiments, the barrier layer 304 is formed of magnesium oxide, aluminum oxide, aluminum nitride, the like or combinations thereof. However, those skilled in the art may select other suitable materials for the free layer 300, the reference layer 302 and the barrier layer 304 according to design or process requirements, the present disclosure is not limited thereto.

In some embodiments, the MTJ 102 further includes a pinning layer 306. The pinning layer 306 may be disposed on the reference layer 302, and is configured to pin the magnetization direction in the reference layer 302 by exchange coupling with the reference layer 302. In some embodiments, the pinning layer 306 is formed of an anti-ferromagnetic material. For instance, the anti-ferromagnetic material may include IrMn, PtMn, or $Ni_xMm_{1-x}(0.1<x<0.5)$. Furthermore, in some embodiments, a synthetic antiferromagnets (SAF) structure (not shown) is further disposed on the reference layer 302. In these embodiments, the SAF structure may be located between the pinning layer 306 and the reference layer 302. The SAF structure may enhance the pinning of the magnetization direction in the reference layer 302, and may include anti-ferromagnetic layers separated by a nonmagnetic spacer layer. For instance, the anti-ferromagnetic layers may respectively include cobalt/platinum (Co/Pt) multilayers, cobalt/palladium (Co/Pd) multilayers or the like, while the spacer layer is such as a ruthenium layer. In alternative embodiments, the MTJ 102 includes the SAF structure for pinning the magnetization direction in the reference layer 302, while the pinning layer 306 is omitted.

Furthermore, in some embodiments, the MTJ 102 further includes a capping layer 308 as an outermost layer (e.g., a topmost layer) in the MTJ 102. In those embodiments where the reference layer 302 is covered by the pinning layer 306, the capping layer 308 may be disposed on the pinning layer 306. The capping layer 308 may protect the underlying layer(s) from etching damage and/or oxidation. According to some embodiments, the capping layer 308 is formed of a conductive material, such as tantalum, tantalum nitride, titanium, titanium nitride, the like or combinations thereof. In alternative embodiments, the capping layer 308 is formed of an insulating material. The insulating material may be substantially oxygen-free, and may include silicon nitride.

Figure 3B:
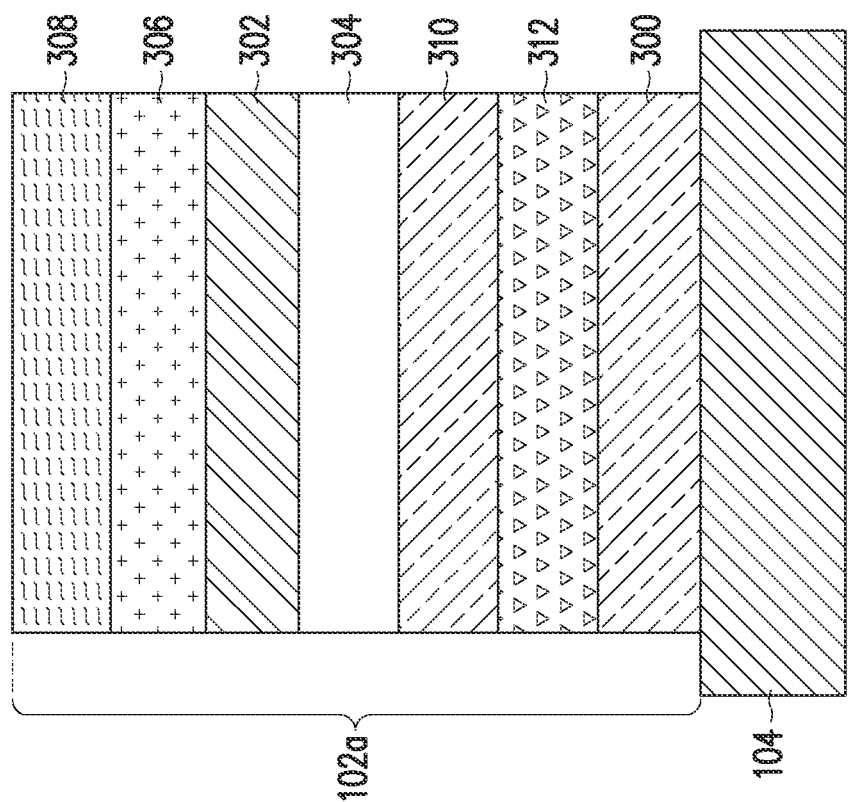

Referring to FIG. 3B, a MTJ 102a is similar to the MTJ 102 described with reference to FIG. 3A, except that the MTJ 102a further includes an additional free layer 310 and a free layer spacer 312. The additional free layer 310 may be disposed between the free layer 300 and the barrier layer 304, and the free layer spacer 312 lies between the free layer 300 and the additional free layer 310. The magnetization directions in the free layer 300 and the additional free layer 310 may be interlocked with each other. In other words, the magnetization direction in the free layer 300 may be aligned with the magnetization direction in the additional free layer 310, and the magnetization directions in the free layer 300 as well as the additional free layer 310 should be altered at the same time. Accordingly, the free layer 300 and the additional free layer 310 should be both programmed during a programming operation. Furthermore, as a result of the interlocked magnetization directions in the free layers 300, 310, the magnetization directions in the free layers 300, 310 may be less likely to be accidentally switched when the MTJ 102a is not selected to be programmed Therefore, the MTJ 102a may have an improved data retention ability. As similar to the free layer 300, the additional free layer 310 may include at least one ferromagnetic layer. The ferromagnetic material for forming the additional free layer 310 may be identical with or different from the ferromagnetic material for forming the free layer 300, the present disclosure is not limited thereto. In addition, the free layer spacer 312 may be formed of a non-magnetic conductive material. For instance, the non-magnetic conductive material may include tungsten, ruthenium, the like or combinations thereof. Further, the free layer spacer 312 may be formed with a crystalline phase similar to or identical with an expected crystalline phase (e.g., body-centered cubic (BCC) phase) of an overlying free layer (e.g., the additional free layer 310), so as to provide a preferable growth template for such overlying free layer. Accordingly, this overlying free layer may be formed with improved crystallinity.

Figure 3C:
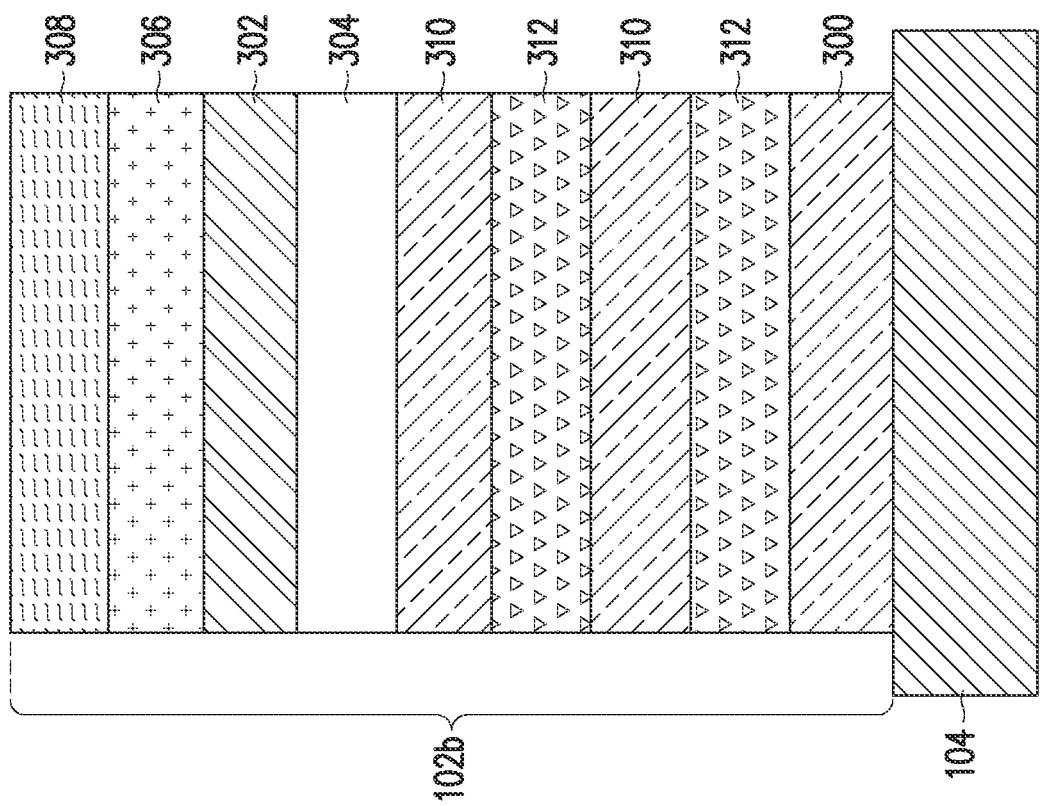

Referring to FIG. 3C, a MTJ 102b includes two pairs of additional free layer 310 and free layer spacer 312 between the free layer 300 and the barrier layer 304. The pairs of additional free layer 310 and free layer spacer 312 may be stacked on the free layer 300, and may be covered by the barrier layer 304. As described above, by further incorporating the additional free layers 310 and the free layer spacers 312, the MTJ 102b may have an even improved data retention ability.

Figure 3D:
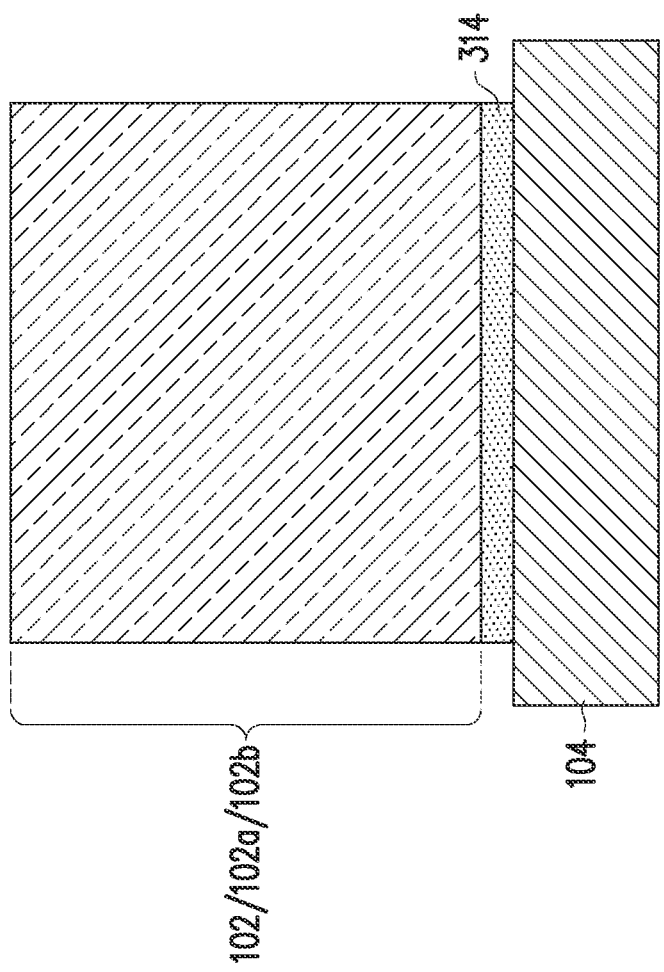

Referring to FIG. 3D, in some embodiments, a diffusion barrier 314 is disposed between the SHE 104 and a MTJ, which may be the MTJ 102 as described with reference to FIG. 3A, the MTJ 102a as described with reference to FIG. 3B or the MTJ 102b as described with reference to FIG. 3C. The diffusion barrier 314 is configured to prevent interdiffusion between the free layer 300 and the SHE 104, and may be formed of a non-magnetic conductive material, such as molybdenum.

Figure 4A:
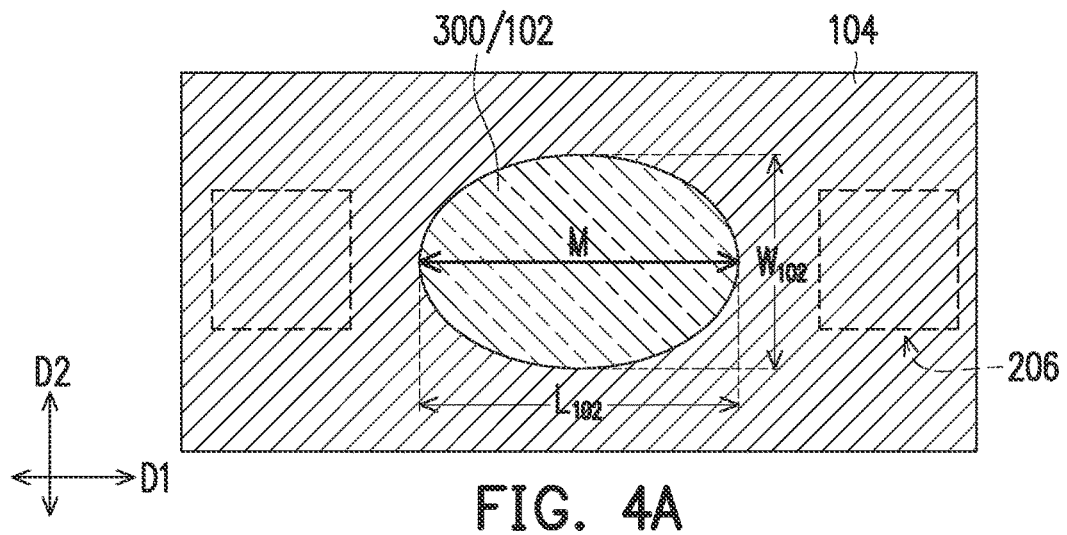
FIG. 4A through FIG. 4C are schematic plan views each illustrating a MTJ standing on a SHE, according to some embodiments of the present disclosure.
Figure 4B:
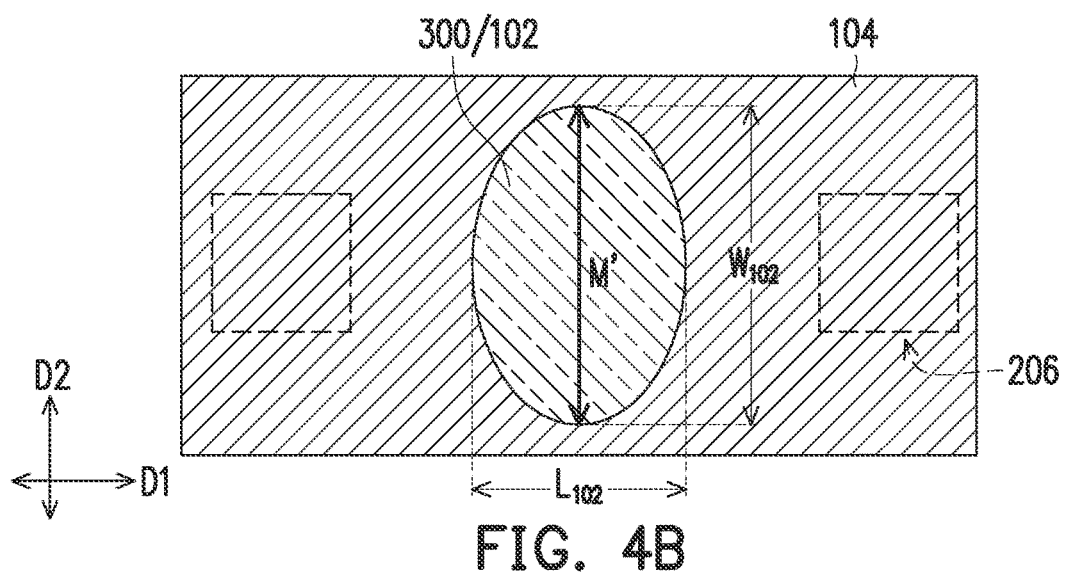
Figure 4C:
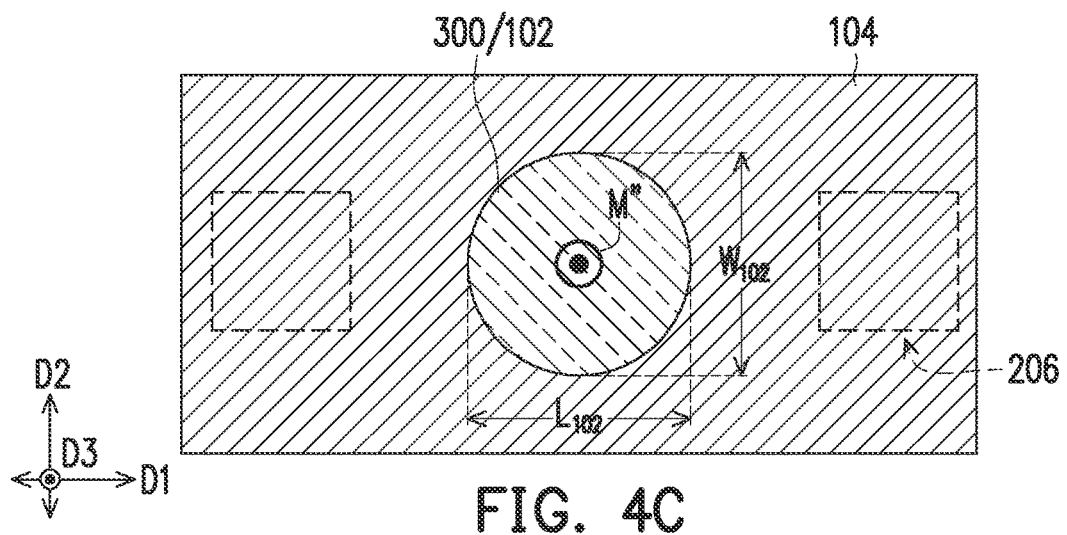

FIG. 4A through FIG. 4C are schematic plan views each illustrating a MTJ standing on a SHE, according to some embodiments of the present disclosure.

Referring to FIG. 4A, in some embodiments, a major axis of the MTJ 102 is substantially aligned or substantially parallel with a major axis of the SHE 104, along which a write path is directed. In these embodiments, a magnetization direction M of the free layer 300 (as described with reference to FIG. 3A) in the MTJ 102 may also be substantially aligned or substantially parallel with the major axis of the SHE 104. As an example illustrated in FIG. 4A, the major axis of the SHE 104 and the directed write path between the bottom vias 206 are along an in-plane direction D1, and the major axis of the MTJ 102 as well as the magnetization direction M of the free layer 300 in the MTJ 102 are along the in-plane direction D1 as well. A ratio of a dimension $L_{102}$ of the MTJ 102 along the in-plane direction D1 over a dimension $W_{102}$ of the MTJ 102 along another in-plane direction D2 perpendicular to the in-plane direction D1 may, for example, range from about 1.5 to about 5.

Referring to FIG. 4B, in some embodiments, a major axis of the MTJ 102 is intersected with (e.g., perpendicular with) a major axis of the SHE 104, along with a write path is directed. In these embodiments, a magnetization direction M' of the free layer 300 in the MTJ 102, which is substantially aligned with the major axis of the MTJ 102, may also be intersected with (e.g., perpendicular with) the major axis of the SHE 104. As an example illustrated in FIG. 4B, the major axis of the SHE 104 and the directed write path between the bottom vias 206 are along the in-plane direction D1, while the major axis of the MTJ 102 as well as the magnetization direction M' of the free layer 300 in the MTJ 102 are along the in-plane direction D2. A ratio of the dimension $L_{102}$ of the MTJ 102 along the in-plane direction D2 over the dimension $W_{102}$ of the MTJ 102 along the in-plane direction D1 may, for example, range from about 1.5 to about 5.

Referring to FIG. 4C, in some embodiments, the MTJ 102 is formed in a substantially symmetrical shape. In these embodiments, a magnetization direction M" of the free layer 300 in the MTJ 102 may be along an out-of-plane direction D3 that is substantially normal to a surface of the SHE 104 in contact with the MTJ 102. In addition, a ratio of the dimension $L_{102}$ of the MTJ 102 along the in-plane direction D1 over the dimension $W_{102}$ of the MTJ 102 along the in-plane direction D2 may be close to or identical with 1.

It should be noted that, the MTJ 102 is exemplarily taken for elaborating various configurations of the SHE 104 and a MTJ standing on the SHE 104. The SHE 104 and the MTJ 102*b* as described with reference to FIG. 3B may have the variations shown in FIG. 4A through FIG. 4C as well. Similarly, the SHE 104 and the MTJ 102*b* as described with reference to FIG. 3C may also have the variations shown in FIG. 4A through FIG. 4C.

FIG. 5A through FIG. 5D are schematic cross-sectional views respectively illustrating an intermediate structure for forming the SHE 104, according to some embodiments of the present disclosure.

Figure 5A:
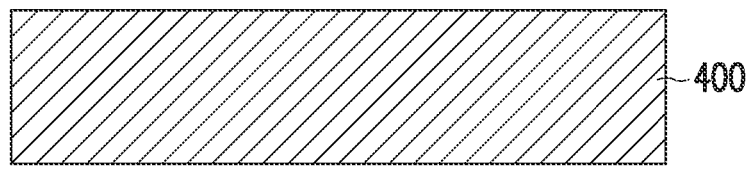
FIG. 5A through FIG. 5D are schematic cross-sectional views respectively illustrating an intermediate structure for forming the SHE, according to some embodiments of the present disclosure.

Referring to FIG. 5A, in some embodiments, a method for forming the SHE 104 includes depositing a layer 400 by using a co-sputtering process. The as-deposited layer 400 contains the alloy having the heavy metal element and the light transition metal element. During the co-sputtering process, a sputtering target including the heavy metal element and another sputtering target including the light transition metal element are used. By adjusting, for example, power inputs, for the sputtering targets, a composition (e.g., Pt/Cr ration, Pt/V ratio etc.) of the as-deposited layer 400 may be altered. A thermal treatment, such as an annealing process, may be subsequently performed on the as-deposited layer 400, for forming the SHE 104. In some embodiments, a process temperature of the thermal treatment ranges from 250° C. to 450° C., and a process time of the thermal treatment ranges from 10 minutes to 60 minutes.

Figure 5B:
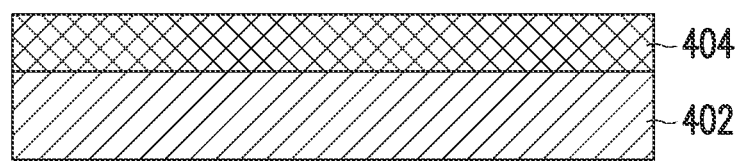

Referring to FIG. 5B, in some embodiments, a method for forming the SHE 104 includes a first sputtering process and a second sputtering process. A first layer 402 is formed by the first sputtering process, and a second layer 404 is formed on the first layer 402 by the second sputtering process. The first layer 402 as well as a sputtering target used in the first sputtering process may include the heavy metal element, while the second layer 404 as well as a sputtering target used in the second sputtering process may include the light transition metal element. Alternatively, the first layer 402 as well as the sputtering target used in the first sputtering process may include the light transition metal element, while the second layer 404 as well as the sputtering target used in the second sputtering process may include the heavy metal element. After deposition of the first and second layers 402, 404, a thermal treatment (e.g., an annealing process) may be performed on the first and second layers 402, 404, such that the heavy metal element and the light transition metal element in the first and second layers 402, 404 may inter-diffuse to form the SHE 104. In some embodiments, a process temperature of the thermal treatment ranges from 250° C. to 450° C., and a process time of the thermal treatment ranges from 10 minutes to 60 minutes. Further, a ratio of a thickness of the first layer 402 over a thickness of the second layer 404 may be adjusted for altering a composition (e.g., Pt/Cr ration, Pt/V ratio etc.) of the SHE 104, the present disclosure is not limited to the thickness of each of the layers 402, 404.

Figure 5C:
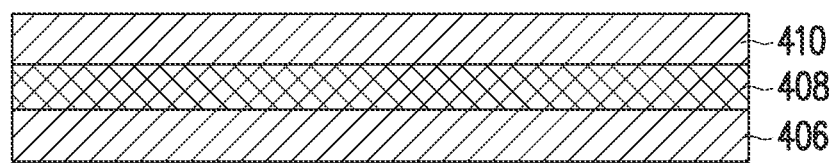

Referring to FIG. 5C, in some embodiments, three sputtering processes are performed for forming the SHE 104. A first layer 406 is formed by a first sputtering process, a second layer 408 is formed on the first layer 406 by a second sputtering process, and a third layer 410 is formed on the second layer 408 by a third sputtering process. The first and third layers 406, 410 as well as the sputtering targets used in the first and third sputtering processes may include the heavy metal element, while the second layer 408 as well as the sputtering target used in the second sputtering process may include the light transition metal element. Alternatively, each of the layers 406, 408, 410 as well as the sputtering target used in the corresponding sputtering process may include the heavy metal element or the light transition metal element, as long as at least one of the layers 406, 408, 410 is formed with the heavy metal element and at least one of the layers 406, 408, 410 is formed with the light transition metal element. After formation of a stacking structure including the layers 406, 408, 410, a thermal treatment (e.g., an annealing process) may be performed on the stacking structure, such that the heavy metal element and the light transition metal element in the layers 406, 408, 410 may inter-diffuse to form the SHE 104. In some embodiments, a process temperature of the thermal treatment ranges from 250° C. to 450° C., and a process time of the thermal treatment ranges from 10 minutes to 60 minutes. Further, a thickness of each of the layers 406, 408, 410 may be adjusted for altering a composition (e.g., Pt/Cr ration, Pt/V ratio etc.) of the SHE 104, the present disclosure is not limited to the thickness of each of the layers 406, 408, 410.

Figure 5D:
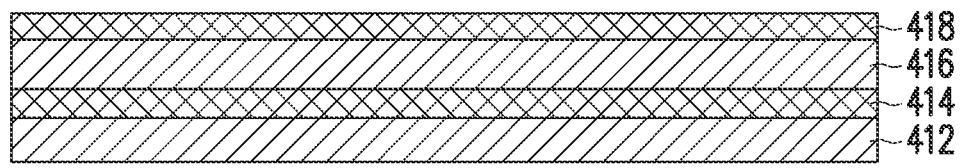

Referring to FIG. 5D, in some embodiments, four sputtering processes are performed for forming the SHE 104. A first layer 412 is formed by a first sputtering process, a second layer 414 is formed on the first layer 412 by a second sputtering process, a third layer 416 is formed on the second layer 414 by a third sputtering process, and a fourth layer 418 is formed on the third layer 416 by a fourth sputtering process. The first and third layers 412, 416 as well as the sputtering targets used in the first and third sputtering processes may include the heavy metal element, while the second and fourth layers 414, 418 as well as the sputtering target used in the second and fourth sputtering processes may include the light transition metal element. Alternatively, each of the layers 412, 414, 416, 418 as well as the sputtering target used in the corresponding sputtering process may include the heavy metal element or the light transition metal element, as long as at least one of the layers 412, 414, 416, 418 is formed with the heavy metal element and at least one of the layers 412, 414, 416, 418 is formed with the light transition metal element. After deposition of a stacking structure including the layers 412, 414, 416, 418, a thermal treatment (e.g., an annealing process) may be performed on the stacking structure, such that the heavy metal element and the light transition metal element in the layers 412, 414, 416, 418 may inter-diffuse to form the SHE 104. In some embodiments, a process temperature of the thermal treatment ranges from 250° C. to 450° C., and a process time of the thermal treatment ranges from 10 minutes to 60 minutes. Further, a thickness of each of the layers 412, 414, 416, 418 may be adjusted for altering a composition (e.g., Pt/Cr ration, Pt/V ratio etc.) of the SHE 104, the present disclosure is not limited to the thickness of each of the layers 412, 414, 416, 418.

Alternatively, more layers may be formed as initial layers to be interfused to form the SHE 104. A gradient of the heavy metal element/light transition metal element may vary, according to an amount of the layers for forming the SHE 104, a thickness of each of these initial layers and/or process temperature/time of the thermal treatment, the present disclosure is not limited thereto. Further, the co-sputtering process or each of the sputtering processes mentioned above may be performed at room temperature. Alternatively, the co-sputtering process or each of the sputtering processes may be performed at elevated temperature.

Figure 6:
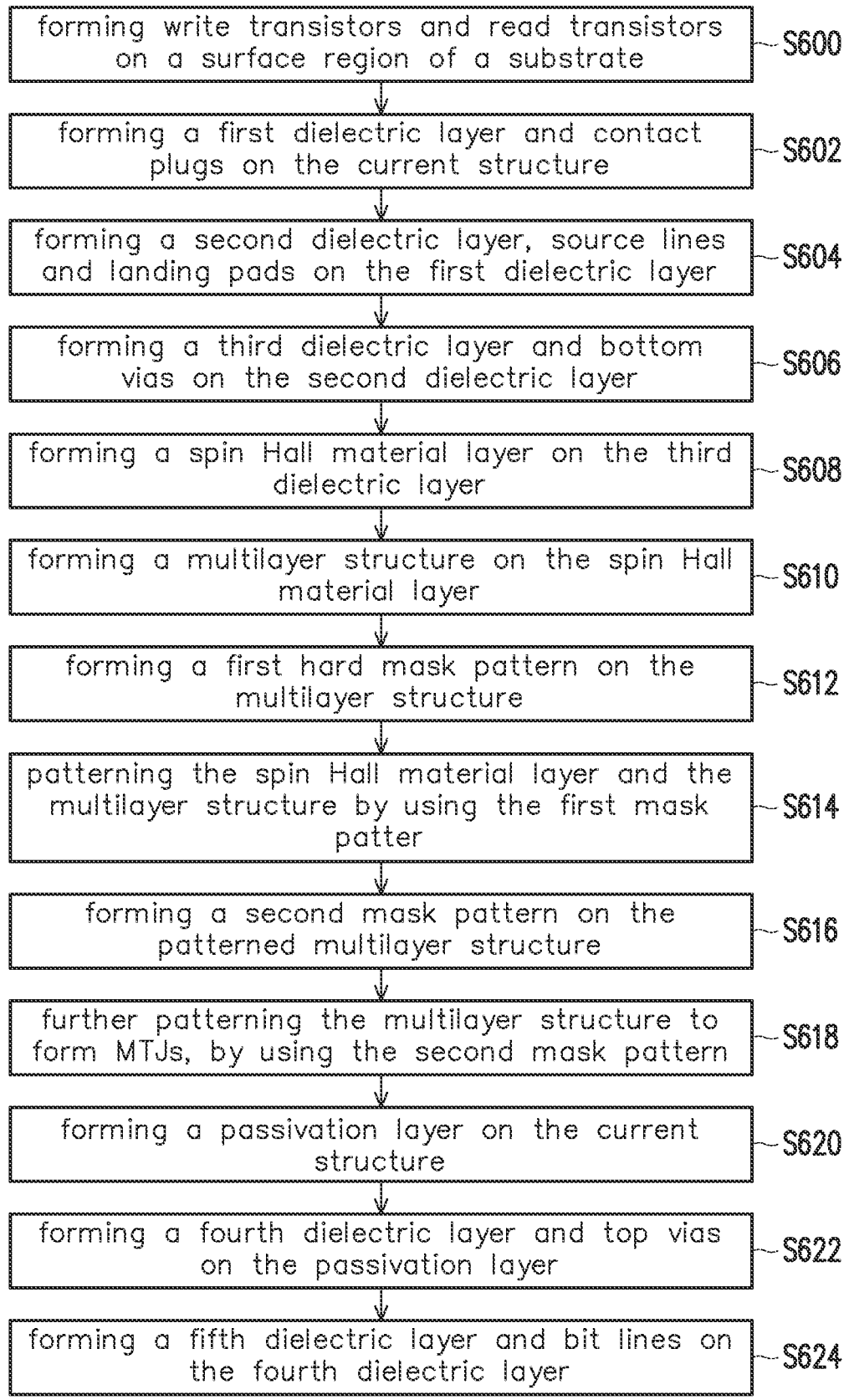
FIG. 6 is a flow diagram illustrating a method for manufacturing adjacent ones of the unit cells each described with reference to FIG. 2, according to some embodiments of the present disclosure.

FIG. 6 is a flow diagram illustrating a method for manufacturing adjacent ones of the unit cells 100 each described with reference to FIG. 2, according to some embodiments of the present disclosure. FIG. 7A through FIG. 7L are schematic cross-sectional views illustrating intermediate structures during the manufacturing process as shown in FIG. 6. Particularly, FIG. 7F through FIG. 7J are enlarged schematic views illustrating intermediate structures for forming and passivating the SHE 104 and the MTJ 102 in a unit cell 100. FIG. 8A through FIG. 8E are schematic plan views of the intermediate structures shown in FIG. 7F through FIG. 7J.

Figure 7A:
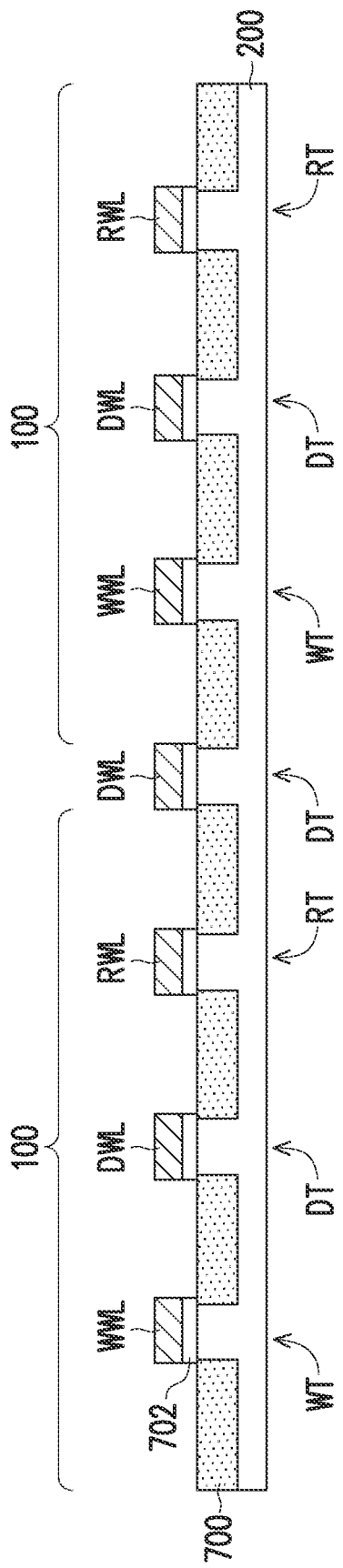
FIG. 7A through FIG. 7L are schematic cross-sectional views illustrating intermediate structures during the manufacturing process as shown in FIG. 6.

Referring to FIG. 6 and FIG. 7A, step S600 is performed, and the write transistors WT as well as the read transistors RT are formed on a surface region of the substrate 200. As described with reference to FIG. 1A and FIG. 2, each of the unit cells 100 may include one of the write transistors WT and one of the read transistors RT. In those embodiments where these transistors are planar-type transistors, the write transistor WT includes a write word line WWL formed over a planar surface of the substrate 200, and source/drain structures 700 formed in a shallow region of the substrate 200. Similarly, the read transistor RT includes a read word line RWL formed over a planar surface of the substrate 200, and source/drain structures 700 formed in the shallow region of the substrate 200. The write word line WWL and the read word line RWL are respectively separated from the substrate 200 by a gate dielectric layer 702. In some embodiments, the isolation transistors DT are formed along with the write transistor WT and the read transistor RT. In these embodiments, the dummy word lines DWL are respectively formed between a write transistor WT and an adjacent read transistor RT, and respectively separated from the substrate 200 by a gate dielectric layer 702.

It should be noted that, the write transistors WT, the read transistors RT and the isolation transistors DT are described herein as the planar-type transistors. However, as described with reference to FIG. 2, the write transistors WT, the read transistors RT and the isolation transistors DT may be alternatively formed as fin-type transistors or GAA transistors, and the structures of the elements in the write transistors WT, the read transistors RT and the isolation transistors DT may be modified accordingly.

Figure 7B:
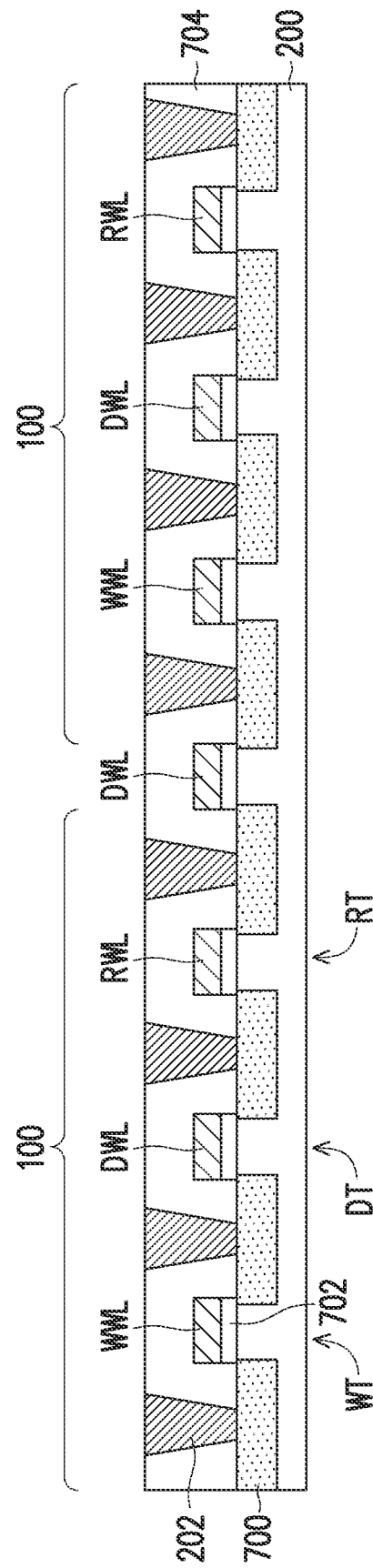

Referring to FIG. 6 and FIG. 7B, step S602 is performed, and a dielectric layer 704 as well as the contact plugs 202 are formed on the current structure. The dielectric layer 704 may cover the write transistors WT, the read transistors RT and the isolation transistors DT. The contact plugs 202 may penetrate through the dielectric layer 704 to establish electrical connection with the source/drain structures 700. In some embodiments, the dielectric layer 704 and the contact plugs 202 are formed by a damascene process (e.g., a single damascene process).

Figure 7C:
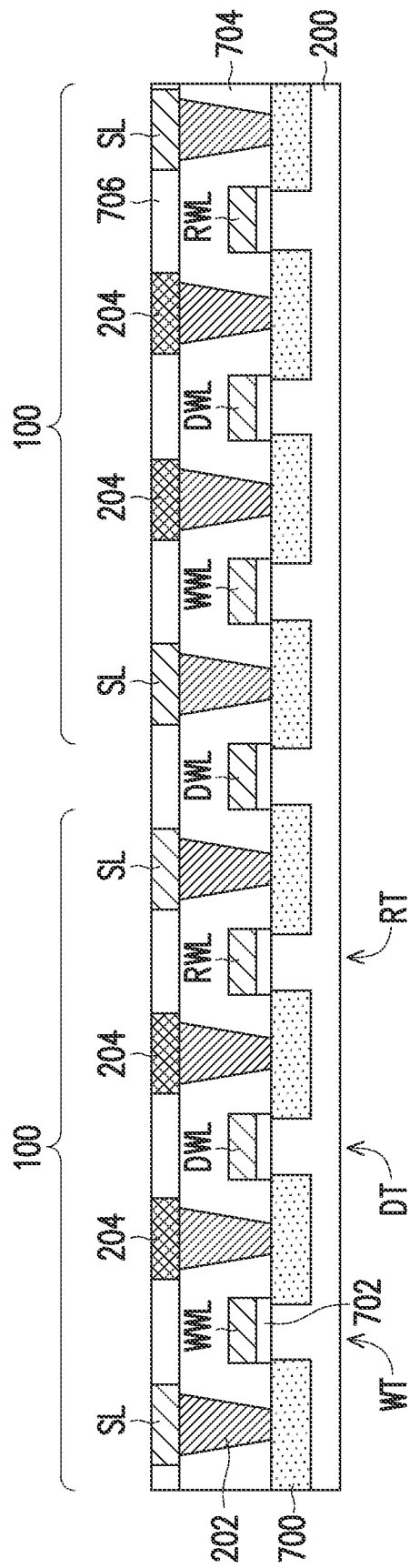

Referring to FIG. 6 and FIG. 7C, step S604 is performed, and a dielectric layer 706 as well as the source lines SL and the landing pads 204 are formed on the dielectric layer 704. The dielectric layer 706 may laterally surround the source lines SL and the landing pads 204, and the source lines SL as well as the landing pads 204 are overlapped and electrically connected to the contact plugs 202. A pair of source line SL and landing pad 204 are connected to the source/drain structures 700 of each write transistor WT through the contact plugs 202 in between. Similarly, a pair of source line SL and landing pad 204 are connected to the source/drain structures 700 of each read transistor RT through the contact plugs 202 in between. In some embodiments, a method for forming the dielectric layer 706, the source lines SL and the landing pads 204 includes a damascene process.

Figure 7D:
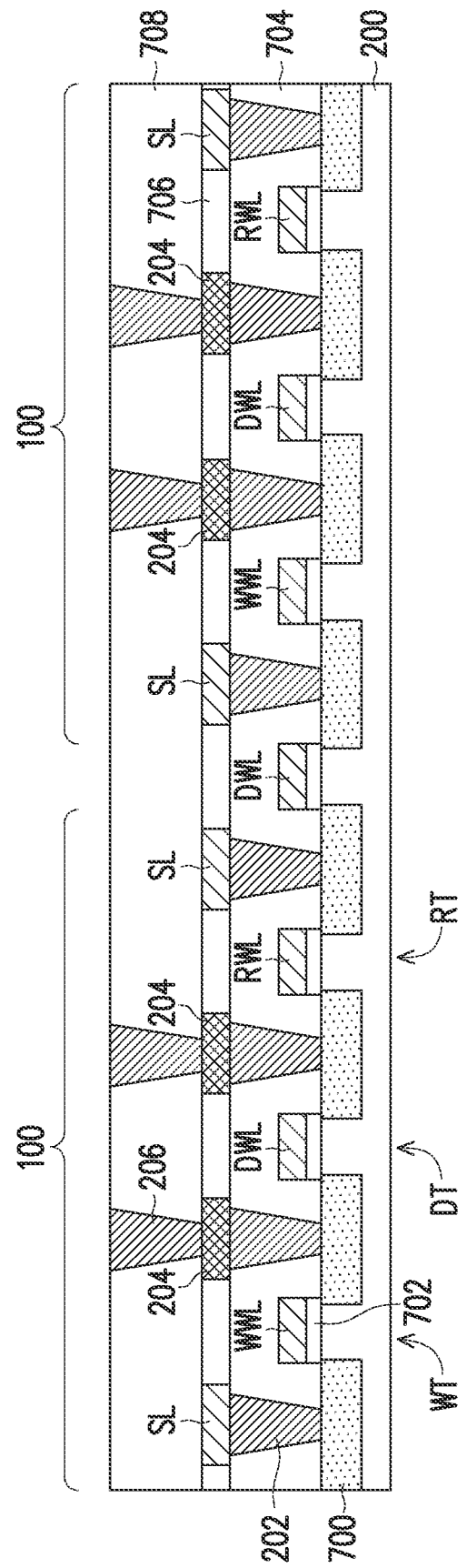

Referring to FIG. 6 and FIG. 7D, step S606 is performed, and a dielectric layer 708 as well as the bottom vias 206 are formed on the dielectric layer 706. The bottom vias 206 may penetrate through the dielectric layer 708, to establish electrical connection with the landing pads 204. In this way, one of the source/drain structures 700 of each write transistor WT is connected to a source line SL, while the other is connected to a bottom via 206 through the landing pad 204 and contact plug 202 in between. Similarly, one of the source/drain structures 700 of each read transistor RT is connected to a source line SL, while the other is connected to a bottom via 206 through the landing pad 204 and contact plug 202 in between. In some embodiments, a method for forming the dielectric layer 708 and the bottom vias 206 includes a damascene process (e.g., a single damascene process).

Figure 7E:
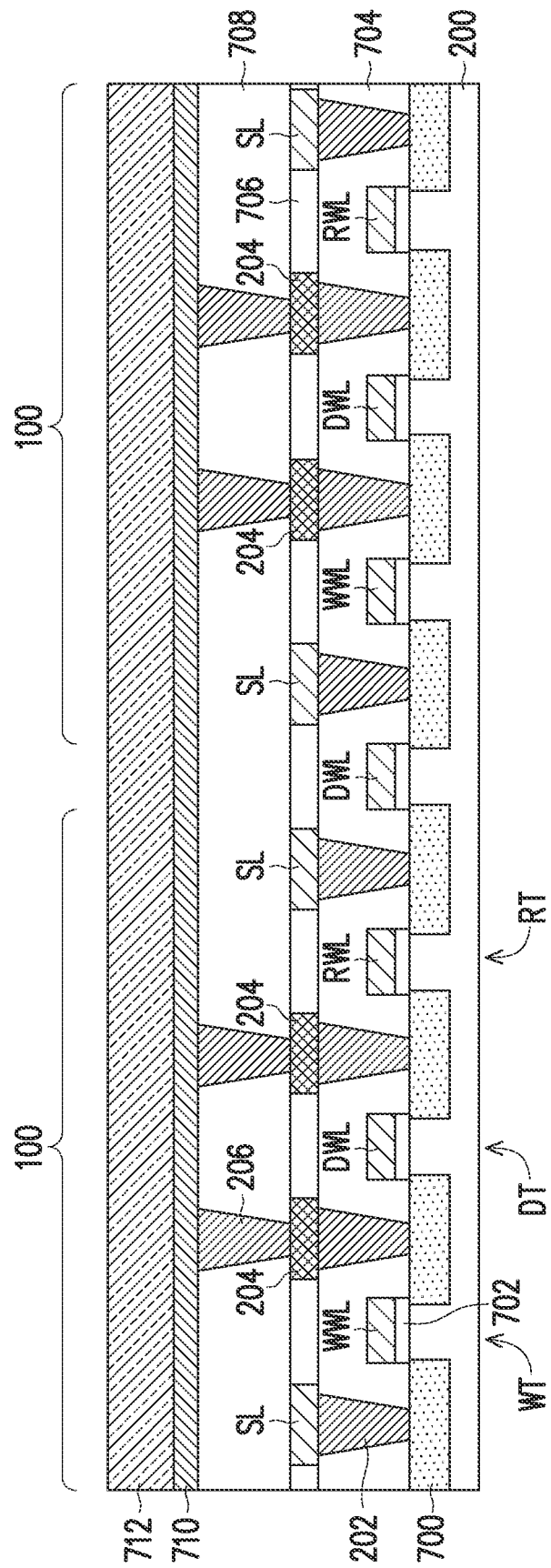

Referring to FIG. 6 and FIG. 7E, step S608 is performed, and a spin Hall material layer 710 is globally formed on the dielectric layer 708. The spin Hall material layer 710 will be patterned to form the SHEs 104 as described with reference to FIG. 1A and FIG. 2, and is formed of the alloy having the heavy metal element and the light transition metal element. As described with reference to FIG. 5A through FIG. 5D, a method for forming the spin Hall material layer 610 may include a single co-sputtering process or multiple sputtering processes, and may include a subsequent thermal treatment.

Thereafter, step S610 is performed, and a multilayer structure 712 is formed on the spin Hall material layer 710. The multilayer structure 712 will be patterned to form the MTJ 102 as described with reference to FIG. 1A and FIG. 2. In some embodiments, a method for forming the multilayer structure 712 includes multiple deposition process, such as sputtering processes, co-sputtering process or combinations thereof.

Furthermore, a barrier material layer (not shown) may be optionally formed on the spin Hall material layer 710 before formation of the multilayer 712, and may be patterned to form the diffusion barrier 314 as described with reference to FIG. 3D, along with the patterning of the multilayer structure 712. In some embodiments, a method for forming the barrier material layer includes a sputtering process or a co-sputtering process.

It should be noted that, the MTJ 102 and the multilayer structure 712 described hereinafter are merely taken for elaborating a manufacturing process for forming the unit cells 100, according to some embodiments. In alternative embodiments where the unit cell 100 uses the MTJ 102a as described with reference to FIG. 3B or the MTJ 102b as described with reference to FIG. 3C, a corresponding multilayer structure rather than the multilayer structure 712 may be formed on the spin Hall material layer 710 in the current step.

Figure 8A:
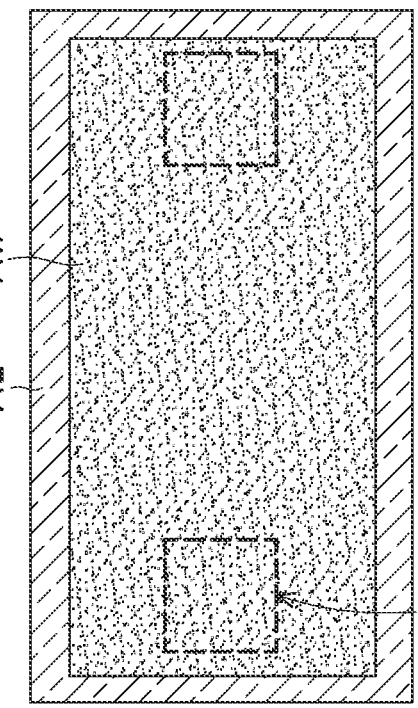
FIG. 8A through FIG. 8E are schematic plan views of the intermediate structures shown in FIG. 7F through FIG. 7J.
Figure 7F:
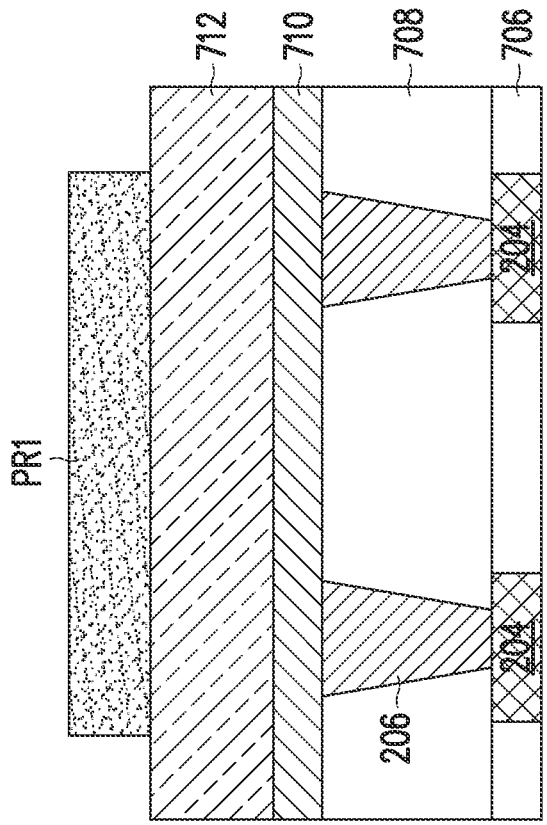

Referring to FIG. 6, FIG. 7F and FIG. 8A, step S612 is performed, and a mask pattern PR1 is formed on the multilayer structure 712. The mask pattern PR1 may have separated portions. Each portion of the mask pattern PR1 is configured to define a boundary of the subsequently formed SHE 104, and overlaps a pair of the bottom vias 206 in each unit cell 100. In some embodiments, the mask pattern PR1 is a photoresist pattern, and may be formed by a lithography process.

Figure 8B:
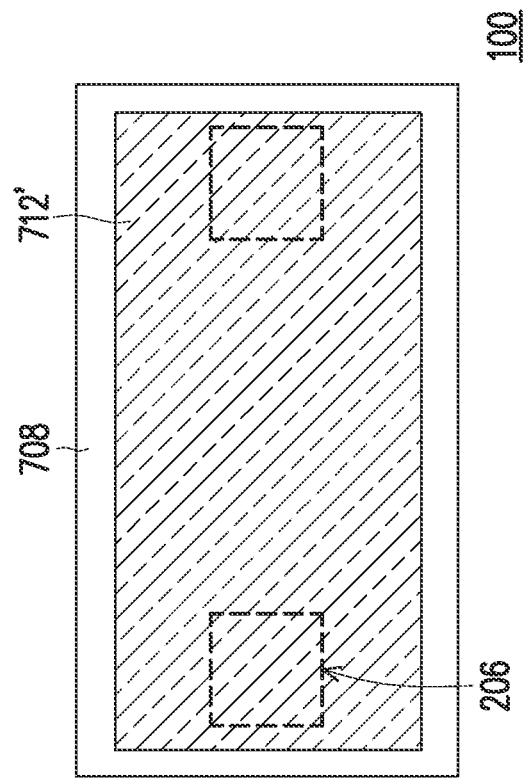
Figure 7G:
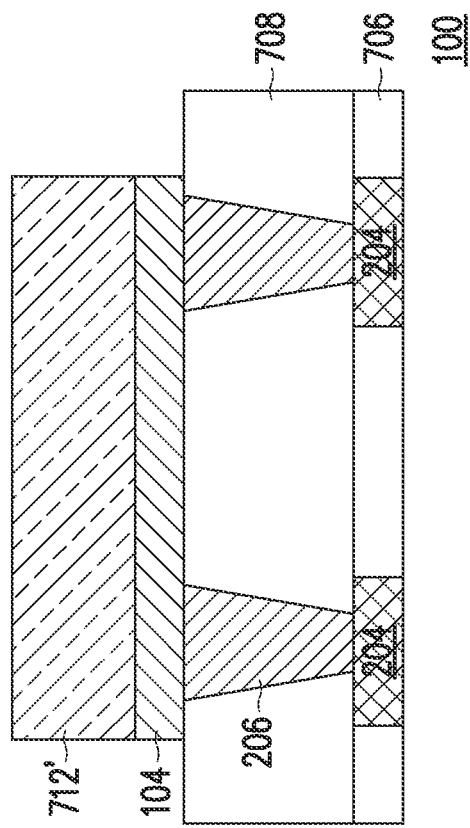

Referring to FIG. 6, FIG. 7G and FIG. 8B, step S614 is performed, and the spin Hall material layer 710 as well as the multilayer structure 712 are patterned by using the mask pattern PR1. The spin Hall material layer 710 is patterned to form the SHE 104. A patterned multilayer structure 712' is formed, and will be further patterned to form the MTJ 102. Currently, a boundary of the patterned multilayer structure 712' is substantially aligned with a boundary of the SHE 104, and may be laterally recessed in the subsequent patterning process. One or more etching processes (e.g., anisotropic etching processes) may be used for the current patterning process. The mask pattern PR1 may be functioned as a shadow mask during the etching processes. Further, the mask pattern PR1 may be removed after the etching processes by, for example, a stripping process or an ashing process.

Figure 8C:
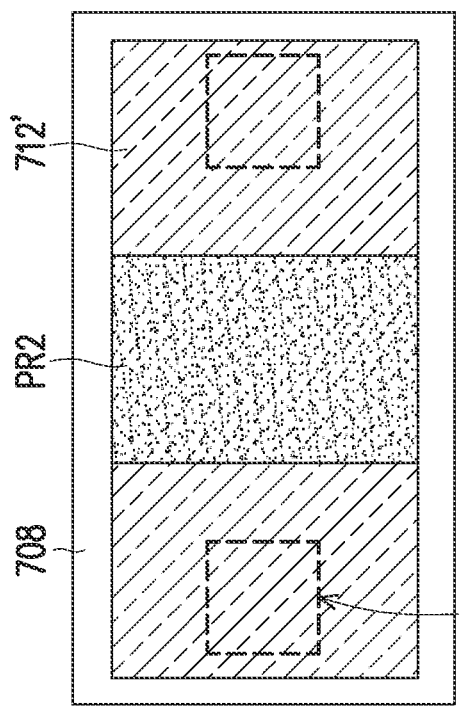
Figure 7H:
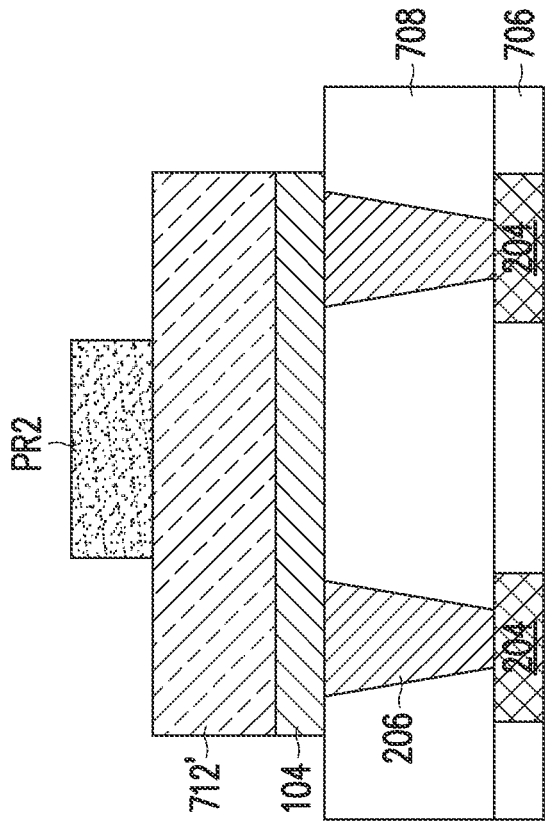

Referring to FIG. 6, FIG. 7H and FIG. 8C, step S616 is performed, and a mask pattern PR2 is formed on the patterned multilayer structure 712'. The mask pattern PR2 may have separated portions. Each portion of the mask pattern PR2 is configured to define the boundary of the subsequently formed MTJ 102, and located between a pair of the bottom vias 206 in each unit cell 100. In some embodiments, the mask pattern PR2 is a photoresist pattern, and may be formed by a lithography process.

Figure 8D:
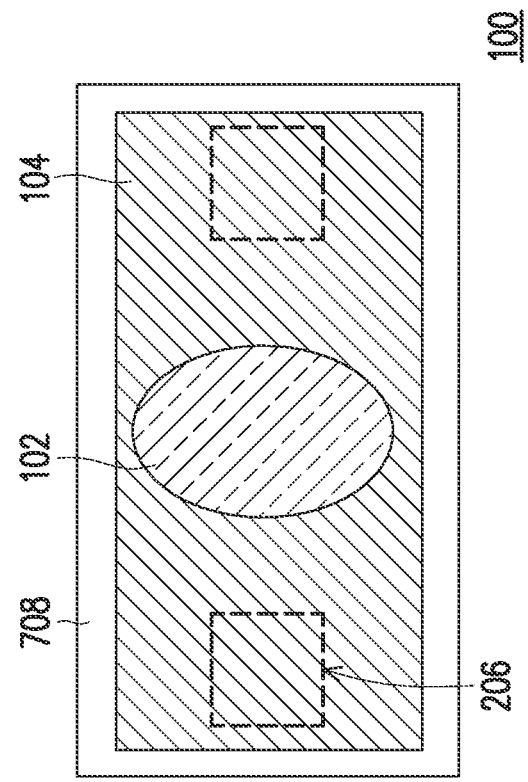
Figure 7I:
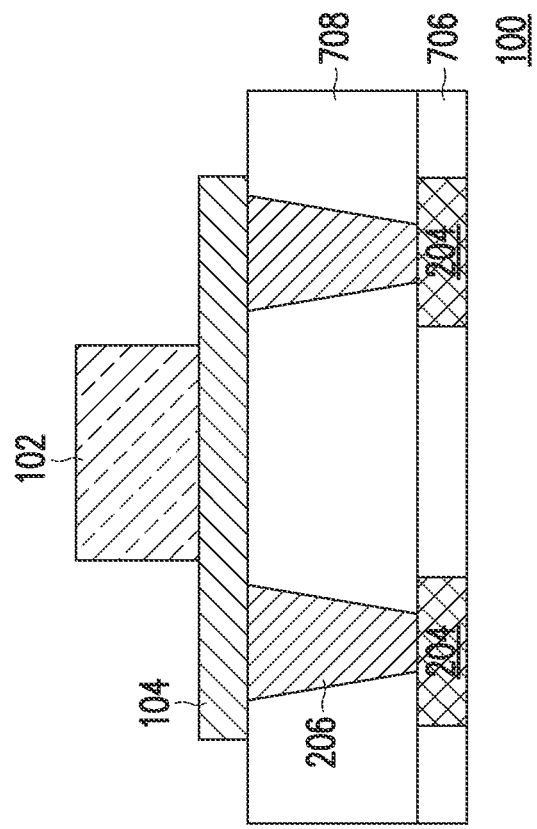

Referring to FIG. 6, FIG. 7I and FIG. 8D, step S618 is performed, and the multilayer structure 712' is further patterned to form the MTJ 102. As down scaling of the MTJ 102, the boundary of the MTJ 102 may not be completely overlapped with the boundary of the mask pattern PR2. For instance, the mask pattern PR2 may have a rectangular boundary, while the MTJ 102 may have an elliptical boundary laterally recessed from the rectangular boundary of the mask pattern PR2. One or more etching processes (e.g., anisotropic etching processes) may be used for the current patterning process. The mask pattern PR2 may be functioned as a shadow mask during the etching processes. Further, the mask pattern PR2 may be removed after the etching processes by, for example, a stripping process or an ashing process.

Figure 8E:
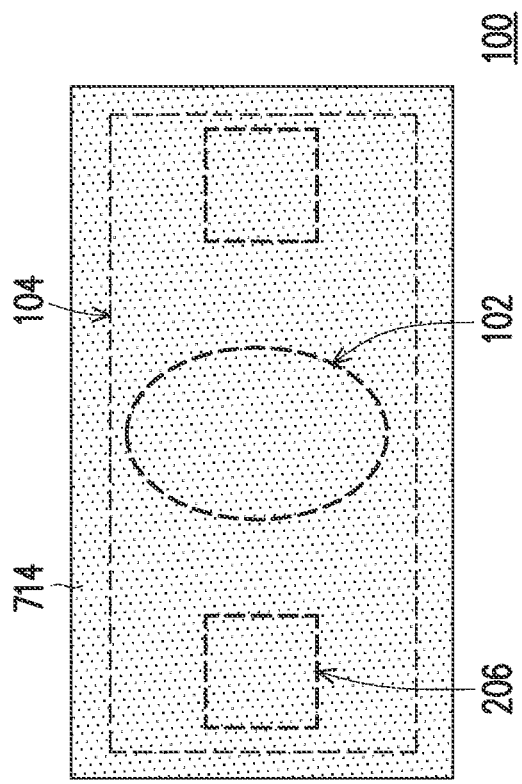
Figure 7J:
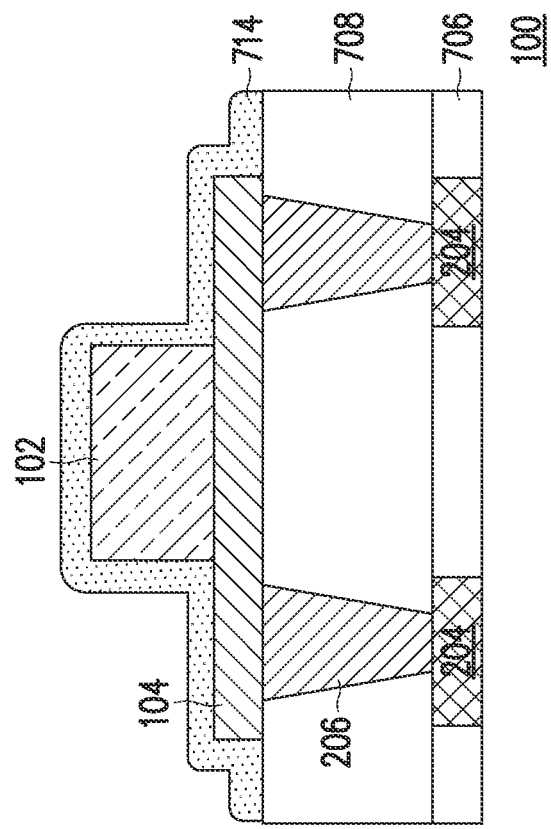

Referring to FIG. 6, FIG. 7J and FIG. 8E, step S620 is performed, and a passivation layer 714 is formed on the current structure. In some embodiments, the passivation layer 714 is globally deposited, and the dielectric layer 708, the SHEs 104 and the MTJs 102 are covered by the passivation layer 714. Further, in some embodiments, the passivation layer 714 conformally spreads on the dielectric layer 708, the SHEs 104 and the MTJs 102. The passivation layer 714 may be formed by an insulating material, e.g., a low-k material such as $SiO_x$, or $SiO_xF_yH_z$. In addition, in some embodiments, a method for forming the passivation layer 714 includes a deposition process, such as a chemical vapor deposition (CVD) process.

Figure 7K:
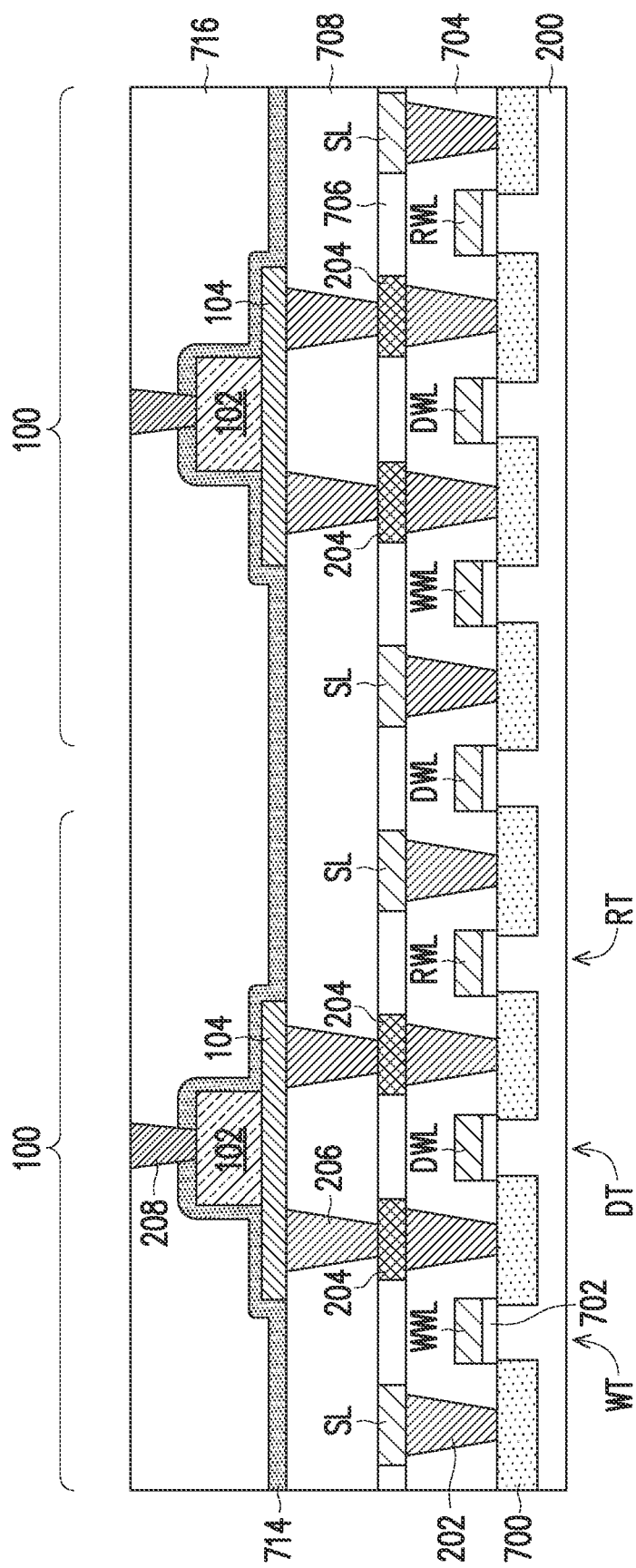

Referring to FIG. 6 and FIG. 7K, step S622 is performed, and a dielectric layer 716 as well as the top vias 208 are formed on the passivation layer 714. The dielectric layer 716 may be formed to a height over a topmost surface of the passivation layer 714, such that the passivation layer 714 may be completely covered by the dielectric layer 716. On the other hand, the top vias 208 extend from a top surface of the dielectric layer 716 to top surfaces of the MTJs 102 through the passivation layer 714. In some embodiments, a method for forming the dielectric layer 716 and the top vias 208 includes a damascene process (e.g., a single damascene process).

Figure 7L:
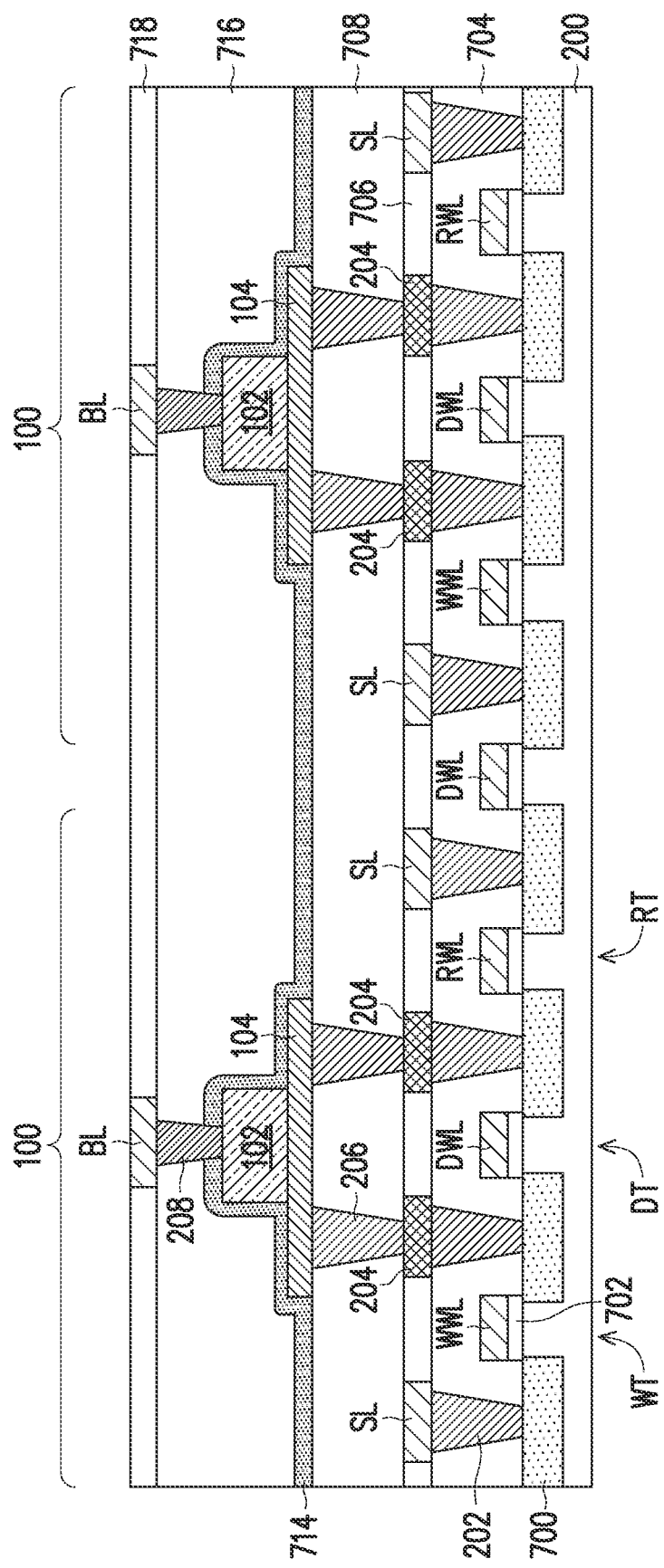

Referring to FIG. 6 and FIG. 7L, step S624 is performed, and a dielectric layer 718 as well as the bit lines BL are formed on the dielectric layer 716. The dielectric layer 718 laterally surrounds the bit lines BL. The bit lines BL overlap with and electrically connect to the top vias 208. In some embodiments, a method for forming the dielectric layer 718 and the bit lines BL includes a damascene process (e.g., a single damascene process). In alternative embodiments, the dielectric layers 716, 718, the top vias 208 and the bit lines BL are formed by a dual damascene process.

Up to here, the unit cells 100 respectively described with reference to FIG. 2 are formed. It should be noted that, some of the elements described with reference to FIG. 7A through FIG. 7L and FIG. 8A through FIG. 8E (e.g., the dielectric layers 704, 706, 708, 716, 718 and the passivation layer 714) are omitted from illustration in FIG. 2. Although the SHEs 104 and the MTJs 102 are described as being formed between first and second metallization layers from bottom of the BEOL structure BE, the SHEs 104 and the MTJs 102 may be alternatively formed between other vertically adjacent metallization layers in the BEOL structure BE, and more conductive features may be formed in the BEOL structure BE for routing the SHEs 104 and the MTJs 102. In addition, further BEOL process may be performed to form a device wafer. Moreover, the device wafer may be subjected to a packaging process to form a plurality of semiconductor packages.

Figure 9:
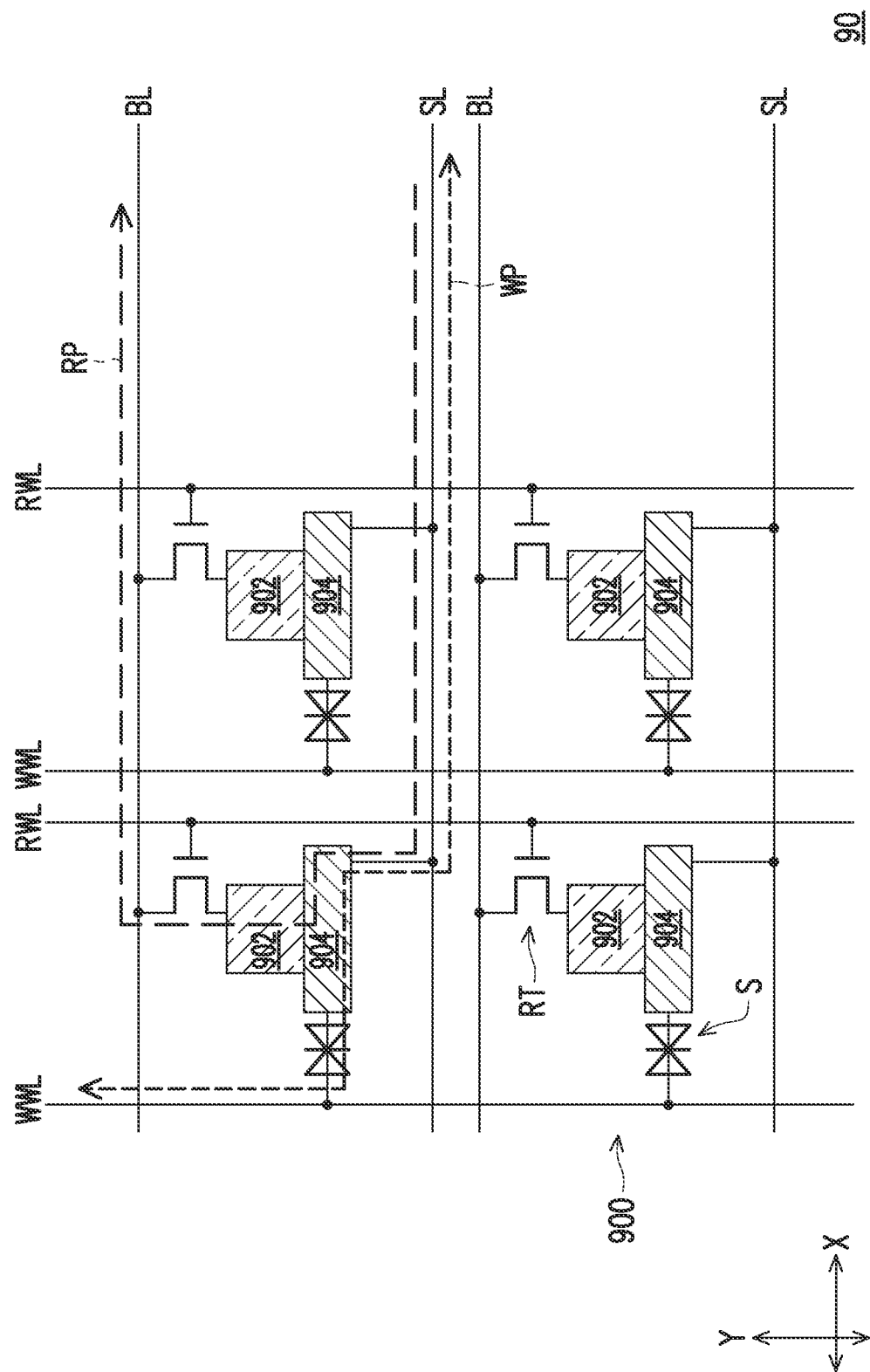
FIG. 9 is a circuit diagram illustrating a memory array according to some other embodiments of the present disclosure.

FIG. 9 is a circuit diagram illustrating a memory array 90 according to some embodiments of the present disclosure.

Referring to FIG. 9, as similar to the memory array 10 as described with reference to FIG. 1A, the memory array 90 includes a plurality of the unit cells 900 arranged along rows and columns Each row of the unit cells 900 may be arranged along the direction X, while each column of the unit cells 900 may be arranged along the direction Y. In addition, each column of the unit cells 900 are coupled to a write word line WWL and a read word line RWL, while each row of the unit cells 900 are coupled to a bit line BL and a source line SL. Although not shown, the write word lines WWL and the read word lines RWL may be coupled to a word line driver circuit, the bit lines BL may be coupled to a bit line driver circuit, and the source lines SL may be coupled to a current source circuit, as described with reference to FIG. 1A.

The unit cell 900 includes a MTJ 902 and a SHE 904 in contact with a free layer in the MTJ 902. As will be described with reference to FIG. 10, a stacking order of the MTJ 902 and the SHE 904 may be different from a stacking order of the MTJ 102 and the SHE 104 as described with reference to FIG. 2. Further, in some embodiments, the SHE 904 is coupled to a write word line WWL through a selector S, while being coupled to a read word line RWL without a selector or a transistor in between. Moreover, in some embodiments, the MTJ 902 is coupled to a bit line BL through a read transistor RT.

The selector S is a two-terminal switching device formed of a pair of electrodes and a switching layer sandwiched between the electrodes. When a sufficient bias is set across the electrodes, the selector S is turned on, and current can flow through the selector. On the other hand, if the selector S is not biased or a bias voltage is not sufficient, the selector S is in an off state, and current may be blocked from flowing through the selector S. In this way, the coupling between the SHE 104 and the write word line WWL can be controlled by the selector S. In some embodiments, the selector S may be an exponential type selector or a threshold type selector. An exponential I-V curve may be observed on the exponential type selector, while a "snapback" I-V curve may be observed on the threshold type selector. For instance, the exponential type selector may be a metal-insulator-metal (MIM) based selector, and the threshold type selector may be a threshold switching selector (e.g., an ovonic threshold switching (OTS) selector, a metal-insulator-transition (MIT) selector, a field assist superlinear threshold (FAST) selector, a mixed ionic-electron conduction (MIEC) selector or the like. In some embodiments, the switching layer of the selector S, also referred to as the selector material layer, is made of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values. In some embodiments, the selector material layer includes an oxygen deficient transition metal oxide. In certain embodiments, the selector material layer is made of a material including $HfO_x$, where 0<x<2. In some embodiments, the thickness of the selector material layer is in a range from about 2 nm to about 20 nm, and is in a range from about 5 nm to about 15 nm in other embodiments.

During a programming operation, the selector S of a selected unit cell 900 is turned on. By setting a voltage difference between the write word line WWL and the source line SL coupled to the selected unit cell 900, a write current WP may flow from the selected write word line WWL to the selected source line SL through the selector S and the SHE 904 in between, or vice versa. As a result of spin orbit interaction, the write current WP flowing through the SHE 904 may induce a SOT on the MTJ 902, thus the MTJ 902 can be subjected to programming. On the other hand, the read transistor RT of the selected unit cell 900 may be kept in an off state, along with the selectors S and the read transistors in unselected unit cells 900.

During a read operation, the read transistor RT of a selected unit cell 900 is turned on. By setting a voltage difference between the bit line BL and the source line SL coupled to the selected unit cell 900, a read current RP may flow from the selected source line SL to the selected bit line BL through the SHE 904, the MTJ 102 and the read transistor RT in between, or vice versa. Due to a spin orbit coupling effect, different magnetization orientations of the MTJ 902 (i.e., the parallel state and the anti-parallel state) may result in difference electrical resistances of the MTJ 902, and may affect a value of the read current RP or a value of a voltage drop across the MTJ 102. Therefore, the bit data stored in the MTJ 902 can be read out. On the other hand, the selector S of the selected unit cell 900 is kept in an off state, along with the read transistors RT and the selectors in unselected unit cells 900.

Figure 10:
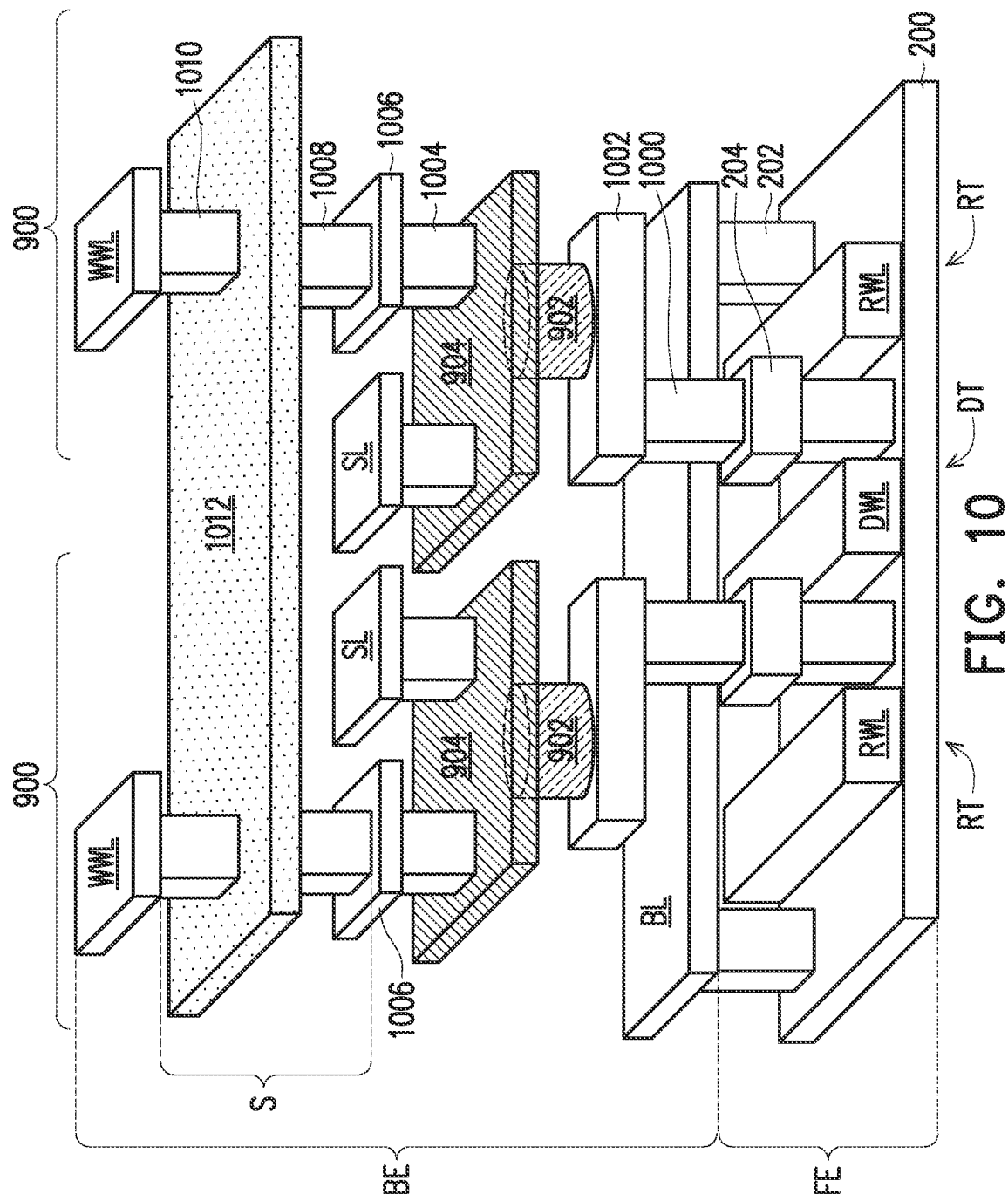
FIG. 10 is a schematic three-dimensional view illustrating adjacent ones of the unit cells in the memory array as shown in FIG. 9, according to some embodiments of the present disclosure.

FIG. 10 is a schematic three-dimensional view illustrating adjacent ones of the unit cells 900 in the memory array 90 as shown in FIG. 9, according to some embodiments of the present disclosure. A structure of the unit cell 900 shown in FIG. 10 is similar to a structure of the unit cell 100 as described with reference to FIG. 2. Only differences between the unit cells 100, 900 will be described, while the same or the like parts in the unit cells 100, 900 may not be repeated again.

Referring to FIG. 10, the FEOL structure FE may no longer include the write transistors WT as described with reference to FIG. 2. Further, the bit line BL coupled to the read transistors RT may be a portion of a bottom metallization layer in the BEOL structure BE, along with the landing pads 204. The bit line BL and the landing pads 204 may be connected to the source and drain terminals of the read transistors RT through the contact plugs 202. Vias 1000 may stand on the landing pads 204, respectively. In some embodiments, landing pads 1002 in another metallization layer are disposed on the vias 1000. The landing pads 1002 overlap and electrically connect to the vias 1000.

According to some embodiments, the MTJs 902 are in contact with the SHEs 904 from below the SHEs 904, rather than standing on the SHEs 904. In these embodiments, the MTJs 902 may stand on the landing pads 1002, and the SHEs 904 may lie on the MTJs 902. The MTJ 902 may include the layers in the MTJ 102 as described with reference to FIG. 3A, the layers in the MTJ 102a as described with reference to FIG. 3B or the layers in the MTJ 102b as described with reference to FIG. 3C, but in a reverse stacking order. In other words, the free layer 300 may be the top layer in the MTJ 902, while the capping layer 308 may be the bottom layer in the MTJ 902. On the other hand, the SHE 904 may be identical with the SHE 104 as described with reference to FIG. 1A, FIG. 2, except that the SHE 904 lies on the MTJ 902. In some embodiments, the diffusion barrier 314 as described with reference to FIG. 3D may be further disposed between the MTJ 902 and the SHE 904. Further, vias 1004 may stand on the SHEs 904, and landing pads 1006 as well as the source lines SL cover and electrically connect to the vias 1004. Each SHE 904 may be connected to one of the source lines SL and one of the landing pads 1006 through the vias 1004 in between.

The selectors S may be disposed on the landing pads 1006. In some embodiments, the selectors S include bottom vias 1008, top vias 1010 overlapping the bottom vias 1008, and a switching layer 1012 lying between the bottom vias 1008 and the top vias 1010. In these embodiments, the selectors S share the common switching layer 1012. A material of the switching layer 1012 may be chosen such that, when biased, electrons may flow across the shortest distance through the switching layer 1012, and not into neighboring unit cells 900. In other words, the biasing has a local effect so that even though the switching layer 1012 laterally extends to neighboring unit cells 900, the biasing may only be effective in the vertical direction to allow electrons to flow through the switching layer 1012 along the vertical direction (e.g., from the top via 1010 to the bottom via 1008, or vice versa). For instance, the switching layer 1012 may be formed of a material including hafnium oxide, and may be doped with Cu, Al, N, P, S, Si, Zr, Gd, Ti, La, Ti, the like or combinations thereof. Moreover, the write word lines WWL may respectively lie on one of the top vias 1010. In some embodiments, the switching layer 1012, also referred to as the selector material layer, is made of a material including $SiO_x$, $TiO_x$, $AlO_x$, $WO_x$, $Ti_xN_yO_z$, $HfO_x$, $TaO_x$, $NbO_x$, or the like, or suitable combinations thereof, where x, y and z are non-stoichiometric values. In some embodiments, the selector material layer includes an oxygen deficient transition metal oxide. In certain embodiments, the selector material layer is made of a material including $HfO_x$, where 0<x<2. In some embodiments, the thickness of the selector material layer is in a range from about 2 nm to about 20 nm, and is in a range from about 5 nm to about 15 nm in other embodiments.

By using the selectors S integrated in the BEOL structure BE for replacing the write transistors WT, a footprint area of each unit cell 900 may be significantly reduced. Accordingly, a storage density of the memory array 90 can be effectively increased. In addition, by disposing the SHEs 904 over the MTJs 902, a material of a seed layer (not shown) as a growth template for the MTJs 902 can be more flexibly chosen without affecting the spin orbit interaction used for a programming operation. Therefore, layers in the MTJs 902 may have an improved crystalline property, and a tunneling magnetoresistance (TMR) of the MTJs 902 may be enhanced.

Figure 11:
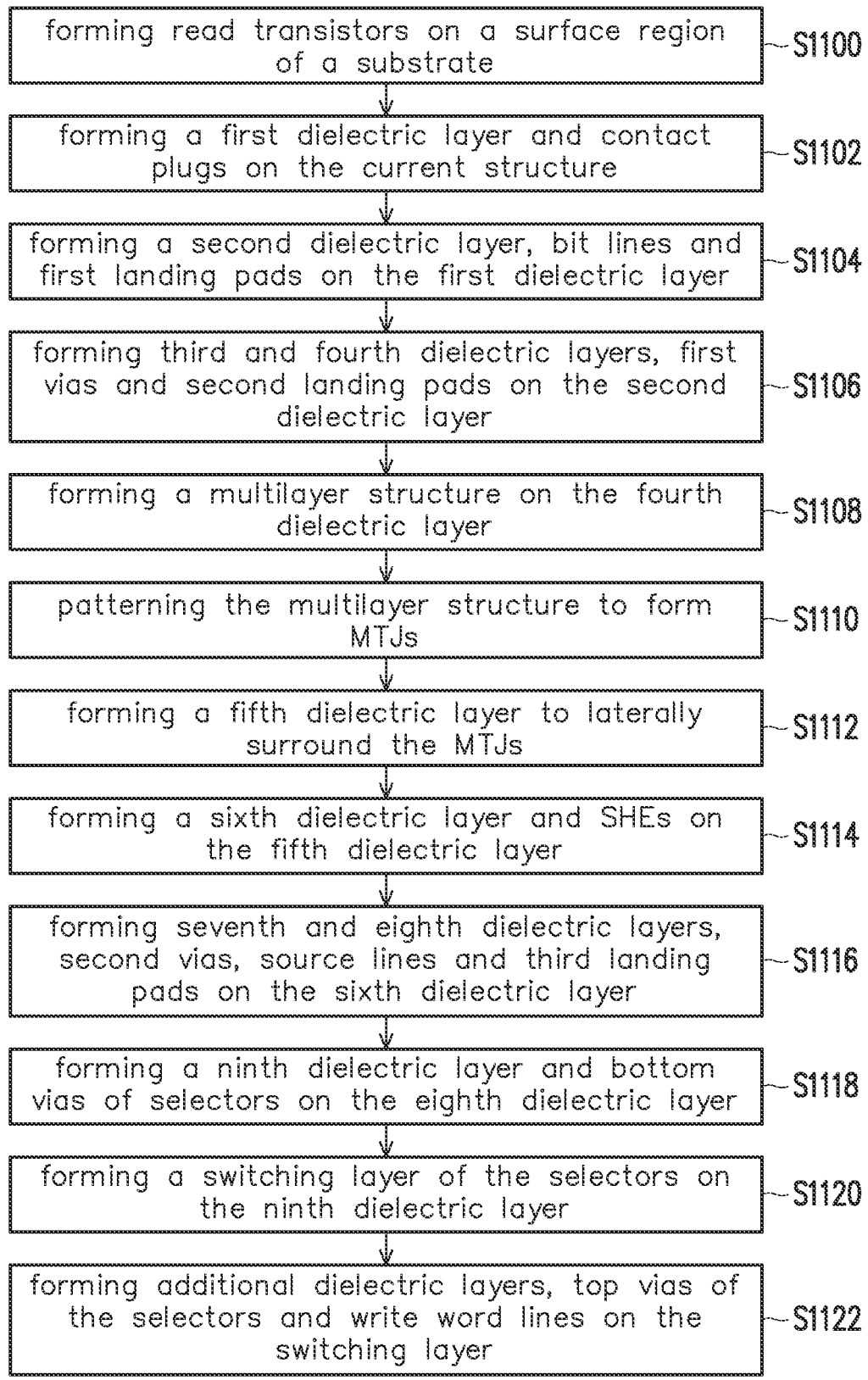
FIG. 11 is a flow diagram illustrating a method for manufacturing adjacent ones of the unit cells described with reference to FIG. 10, according to some embodiments of the present disclosure.

FIG. 11 is a flow diagram illustrating a method for manufacturing adjacent ones of the unit cells 900 described with reference to FIG. 10, according to some embodiments of the present disclosure. FIG. 12A through FIG. 12L are schematic cross-sectional views illustrating intermediate structures during the manufacturing process as shown in FIG. 11.

It should be noted that, the manufacturing process shown in FIG. 11 and FIG. 12A through FIG. 12L is similar to the manufacturing process described with reference to FIG. 6 and FIG. 7A through FIG. 7L, thus only differences between these manufacturing processes will be described. The same or similar parts in these manufacturing processes may not be repeated again, and the same or similar elements may be labeled identically. As an example, the similar/identical parts may include using single damascene processes, dual damascene processes or combinations thereof for forming dielectric layers and conductive features (e.g., contact plugs, landing pads and vias) in the dielectric layers.

Figure 12A:
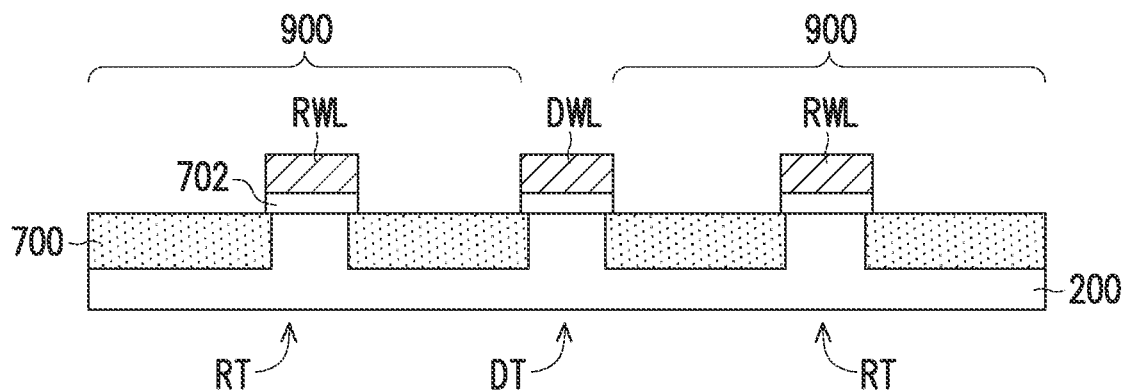
FIG. 12A through FIG. 12L are schematic cross-sectional views illustrating intermediate structures during the manufacturing process as shown in FIG. 11.

Referring to FIG. 11 and FIG. 12A, step S1100 is performed, and the read transistors RT are formed on a surface region of the substrate 200. In some embodiments, the isolation transistors DT are formed along with the read transistors RT. In these embodiments, the dummy word lines DWL are respectively formed between adjacent ones of the read transistors RT.

Figure 12B:
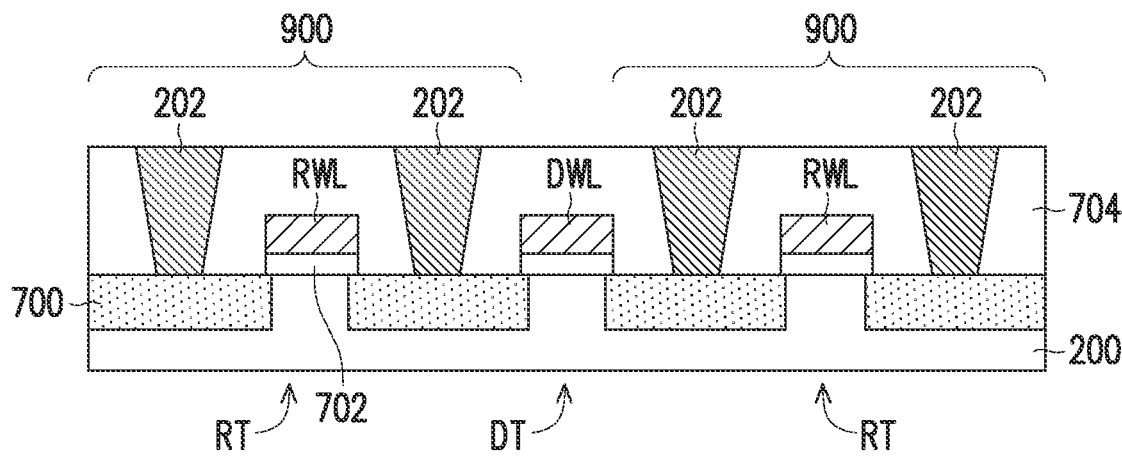

Referring to FIG. 11 and FIG. 12B, step S1102 is performed, and the dielectric layer 704 as well as the contact plugs 202 are formed on the current structure. The contact plugs 202 penetrate through the dielectric layer 704, to establish electrical connection with the source/drain structures 700 of the read transistors RT.

Figure 12C:
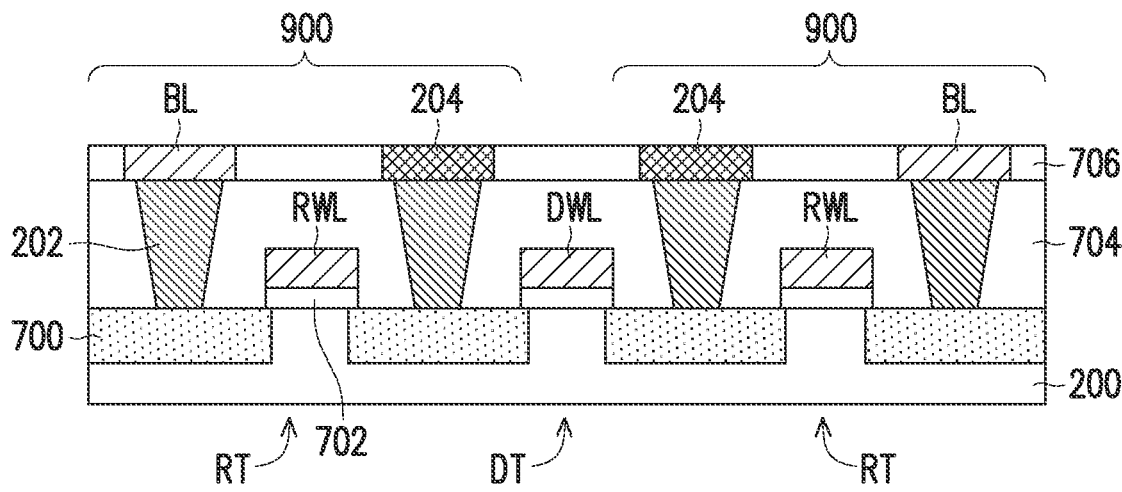

Referring to FIG. 11 and FIG. 12C, step S1104 is performed, and the dielectric layer 706 as well as the bit lines BL and the landing pads 204 are formed on the dielectric layer 704. The bit lines BL and the landing pads 204 are laterally surrounded by the dielectric layer 704. The source/drain structures 700 of each read transistor RT are connected to one of the landing pads 204 and one of the bit lines BL through the contact plugs 202 in between. Although illustrated otherwise hereinafter, adjacent read transistor RT in the same row may be coupled to the same bit line BL, as described with reference to FIG. 9.

Figure 12D:
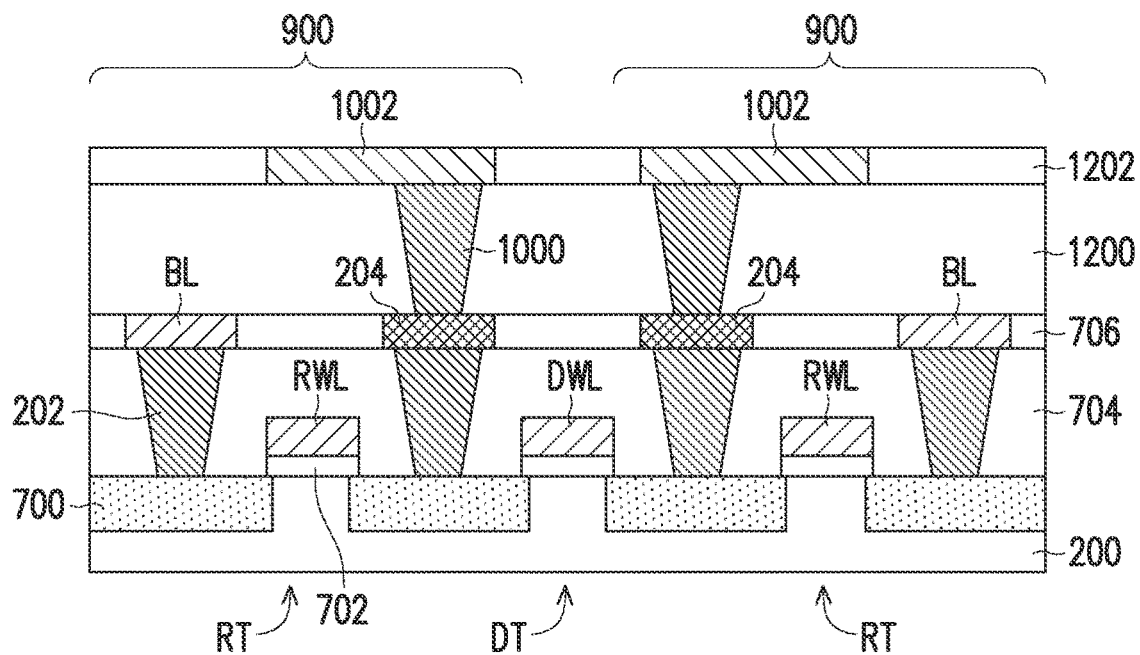

Referring to FIG. 11 and FIG. 12D, step S1106 is performed, and dielectric layers 1200, 1202 as well as the vias 1000 and the landing pads 1002 are formed on the dielectric layer 706. The dielectric layer 1202 is stacked on the dielectric layer 1200. The vias 1000 extend through the dielectric layer 1200, to reach the underlying landing pads 204 in the dielectric layer 706, so as to establish electric connection with the landing pads 204. The landing pads 1002 are laterally surrounded by the dielectric layer 1202, and overlap and electrically connect to the vias 1000, respectively.

Figure 12E:
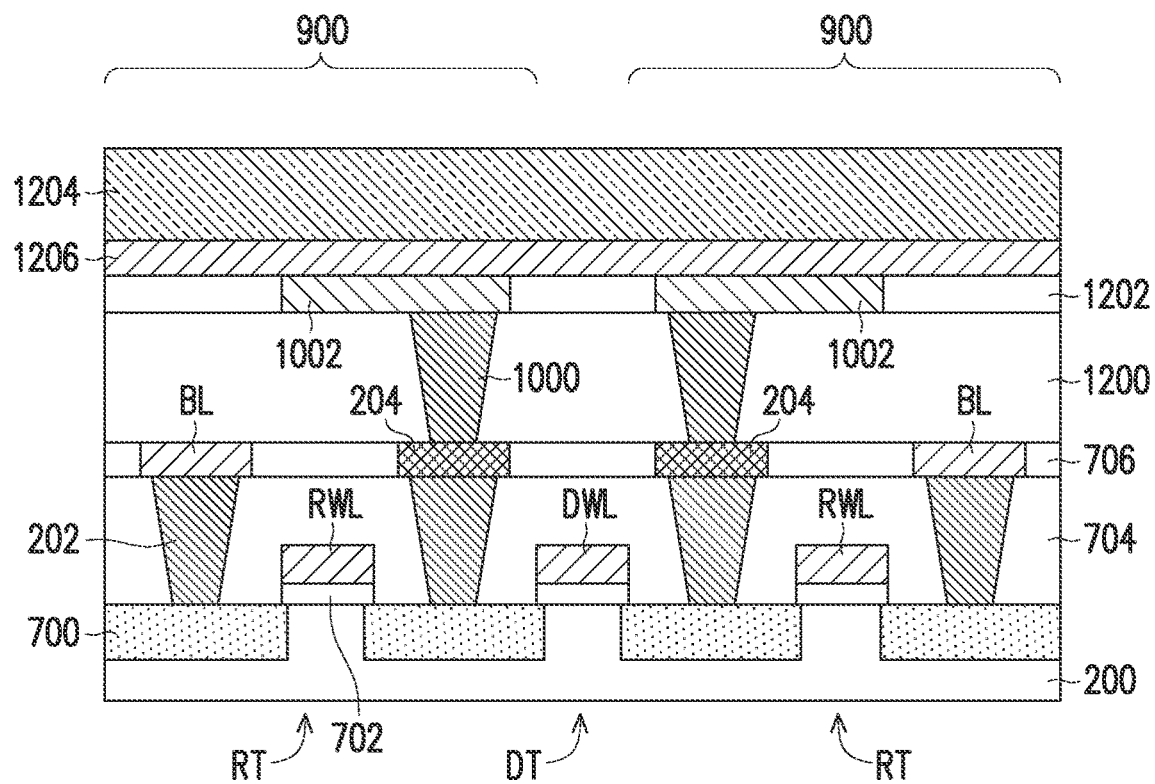

Referring to FIG. 11 and FIG. 12E, step S1108 is performed, and a multilayer structure 1204 is formed on the dielectric layer 1202. The multilayer structure 1204 will be patterned to form the MTJ 902 as described with reference to FIG. 9 and FIG. 10. In some embodiments, a method for forming the multilayer structure 1204 includes multiple deposition process, such as sputtering processes, co-sputtering process or combinations thereof.

In some embodiments, an electrode layer 1206 is pre-formed on the dielectric layer 1202 before formation of the multilayer structure 1204. In these embodiments, the electrode layer 1206 may be patterned along with the multilayer structure 1204 in a subsequent step. A method for forming the electrode layer 1206 may include a sputtering process or a co-sputtering process.

Figure 12F:
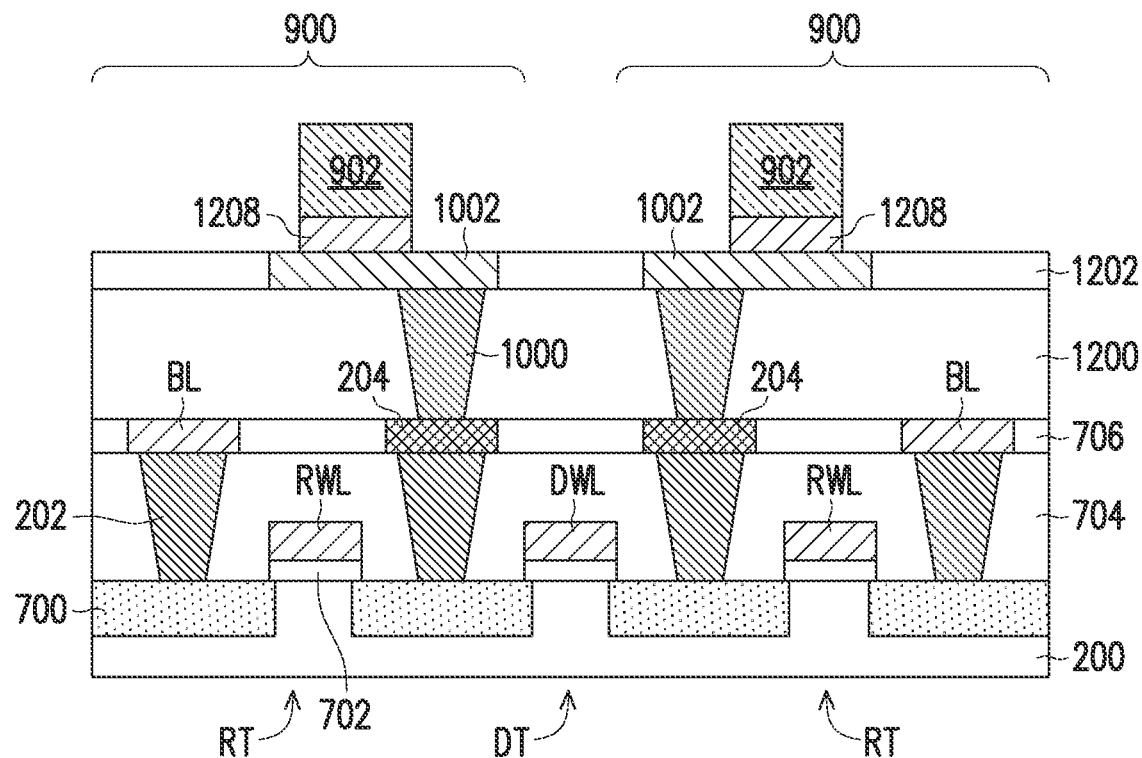

Referring to FIG. 11 and FIG. 12F, step S1110 is performed, and the multilayer structure 1204 is patterned to form the MTJs 902. Such patterning may include a lithography process and one or more etching processes. In those embodiments where the electrode layer 1206 is pre-formed on the dielectric layer 1202 before formation of the multilayer structure 1204, the electrode layer 1206 may be patterned along with the multilayer structure 1204, to form electrodes 1208.

Figure 12G:
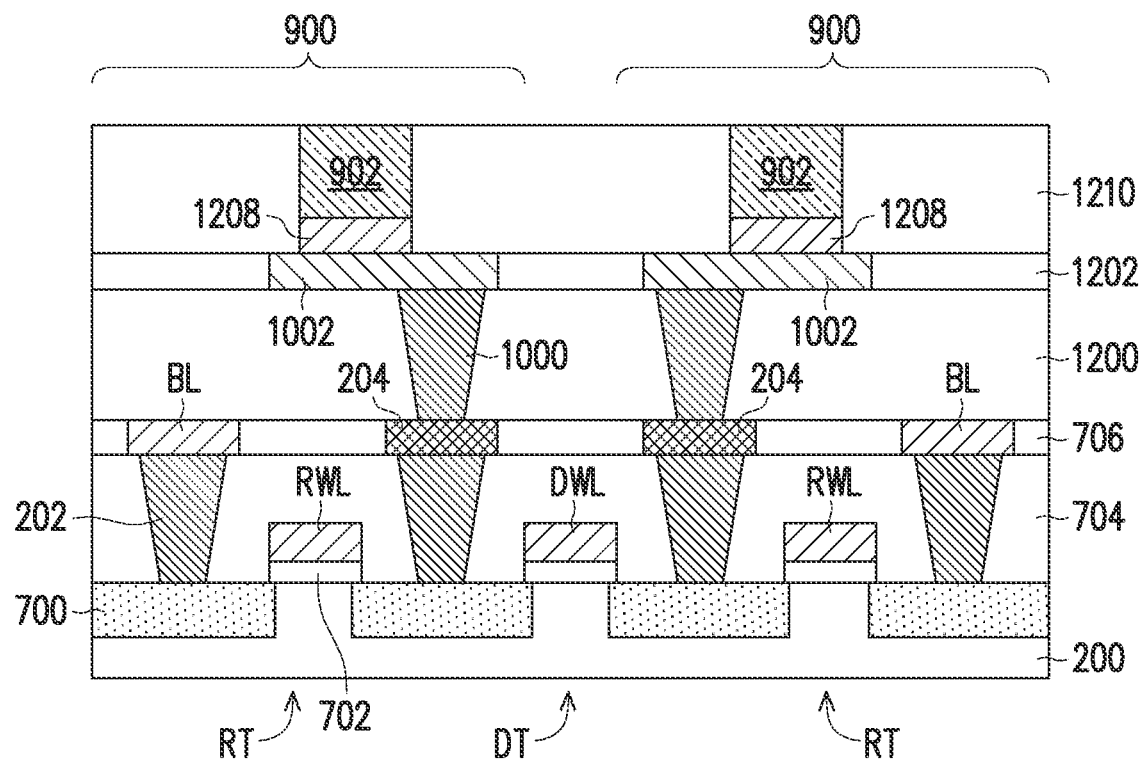

Referring to FIG. 11 and FIG. 12G, step S1112 is performed, and a dielectric layer 1210 is formed to laterally surround the MTJs 902. A method for forming the dielectric layer 1210 may include a deposition process (e.g., a CVD process) and a planarization process (e.g., a polishing process, an etching process or a combination thereof).

Figure 12H:
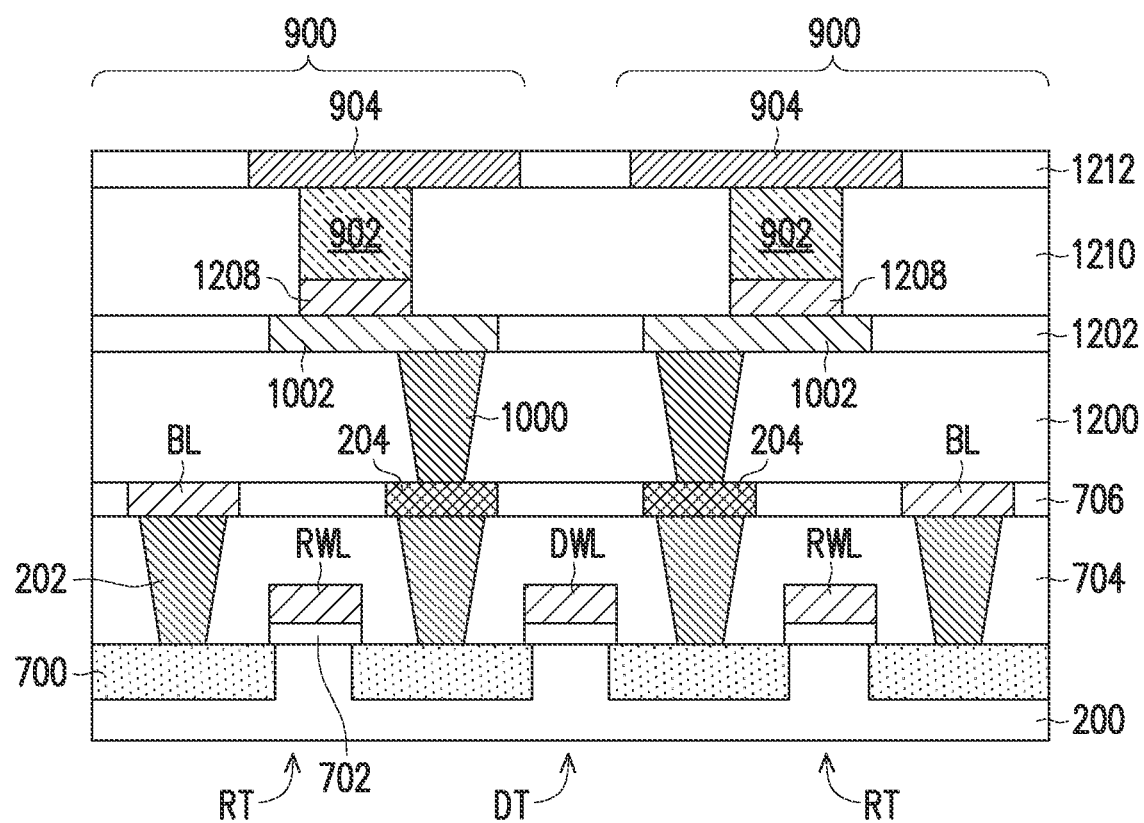

Referring to FIG. 11 and FIG. 12H, step S1114 is performed, and a dielectric layer 1212 as well as the SHEs 904 are formed on the dielectric layer 1210. The SHEs 904 are laterally surrounded by the dielectric layer 1212. According to some embodiments, a method for forming the dielectric layer 1212 may include forming a dielectric material layer on the dielectric layer 1210 and the MTJs 902. Subsequently, the dielectric material layer may be patterned to form the dielectric layer 1212 with openings by a lithography process and an etching process. Thereafter, a spin Hall material layer may be formed on the dielectric layer 1212, and may fill up the openings in the dielectric layer 1212. As described with reference to FIG. 5A through FIG. 5D, a method for forming the spin Hall material layer may include a single co-sputtering process or multiple sputtering processes, and may include a subsequent thermal treatment. Further, a planarization process may be performed for removing portions of the spin Hall material layer above the dielectric layer 1212. Remained portions of the spin Hall material layer may form the SHEs 904.

Figure 12I:
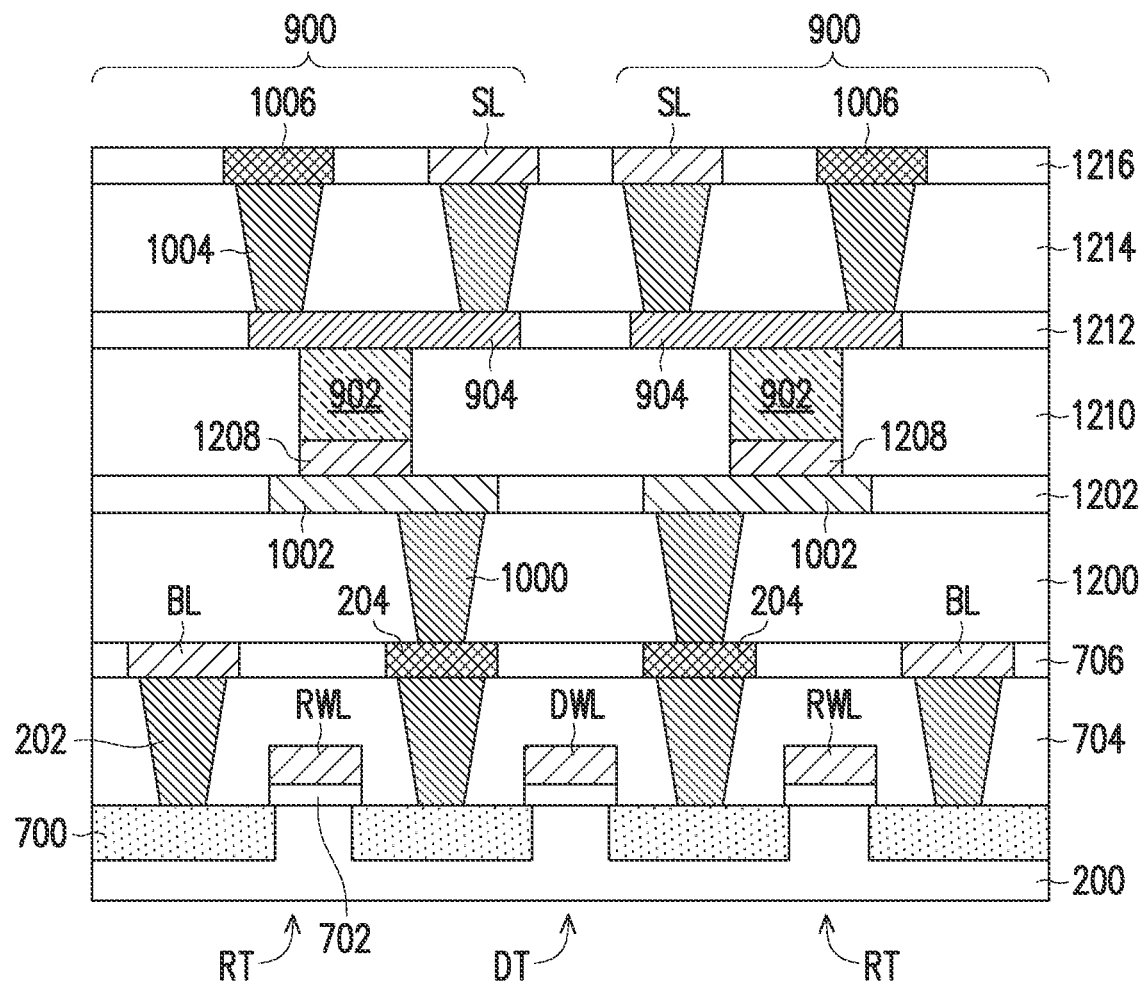

Referring to FIG. 11 and FIG. 12I, step S1116 is performed, and dielectric layers 1214, 1216 as well as the vias 1004, the source lines SL and the landing pads 1006 are formed on the dielectric layer 1212. The dielectric layer 1216 is stacked on the dielectric layer 1214. The vias 1004 penetrate through the dielectric layer 1214, to reach the SHEs 904 in the dielectric layer 1212, so as to establish electrical connection with the SHEs 904. The landing pads 1006 and the source lines SL are laterally surrounded by the dielectric layer 1216, and overlap and electrically connect to the vias 1004. Each SHE 904 may be electrically connected to one of the source lines SL and one of the landing pads 1006 through the vias 1004 in between. It should be noted that, although illustrated otherwise hereinafter, adjacent read transistor RT in the same row may be coupled to the same source line SL, as described with reference to FIG. 9.

Figure 12J:
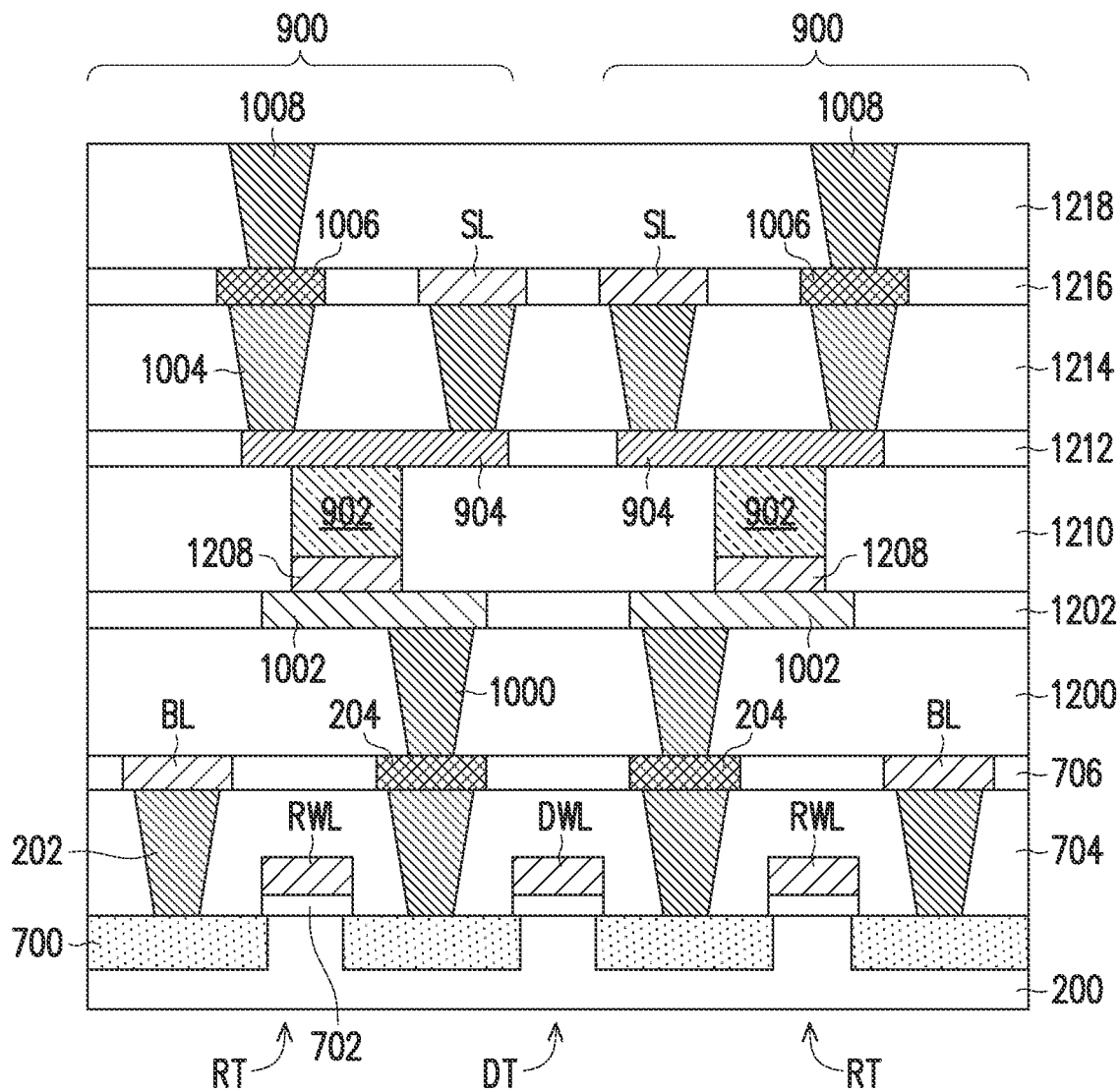

Referring to FIG. 11 and FIG. 12J, step S1118 is performed, and a dielectric layer 1218 and the bottom vias 1008 of the selectors S are formed on the dielectric layer 1216. The bottom vias 1008 penetrate through the dielectric layer 1218, to reach the landing pads 1216, in order to establish electrical connection with the landing pads 1216.

Figure 12K:
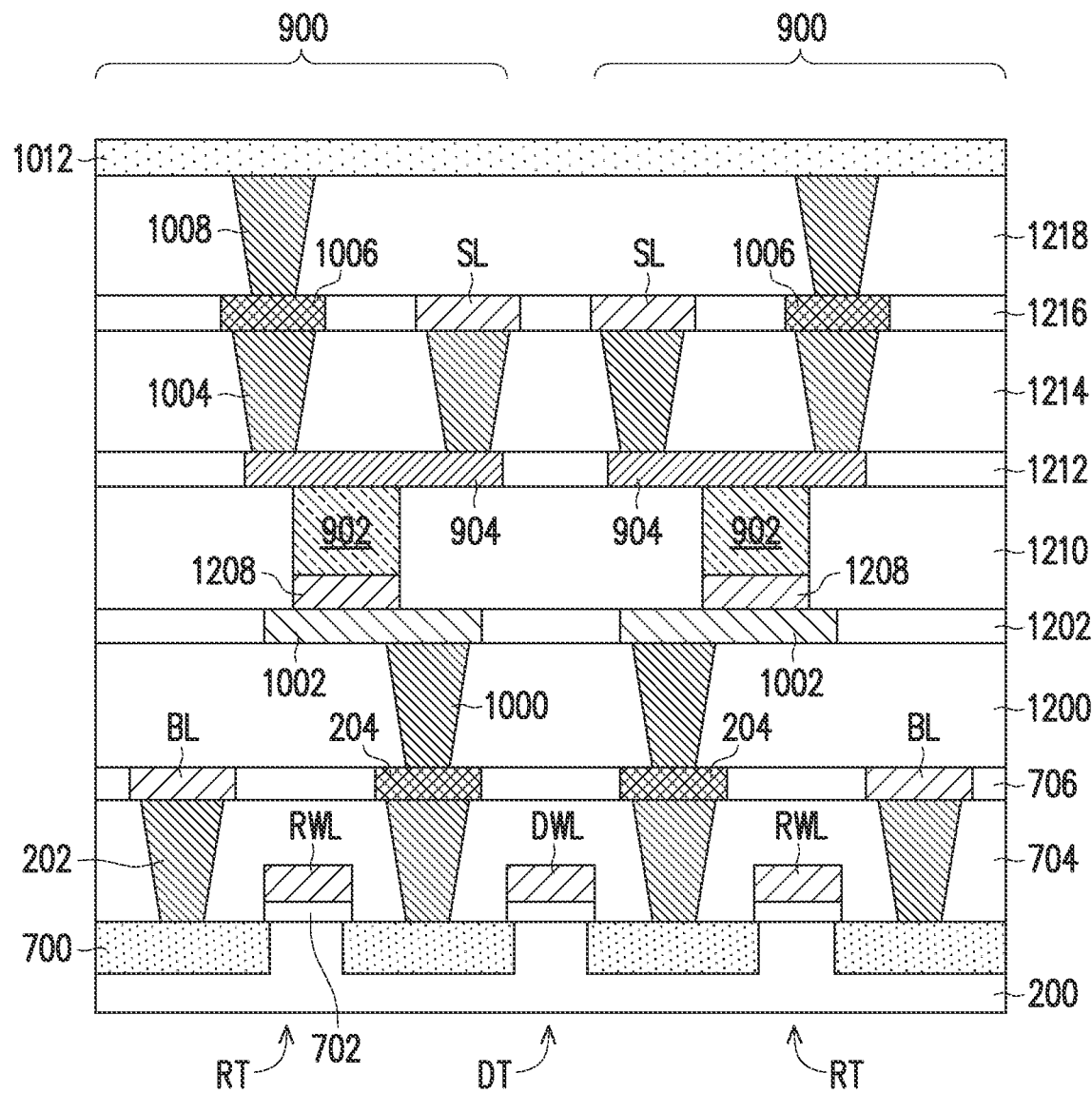

Referring to FIG. 11 and FIG. 12K, step S1120 is performed, and the switching layer 1012 of the selectors S is formed on the dielectric layer 1218. According to some embodiments, the switching layer 1012 is globally formed on the dielectric layer 1218. In some embodiments, a method for forming the switching layer 1012 includes a deposition process, such as a CVD process or a physical vapor deposition (PVD) process.

Figure 12L:
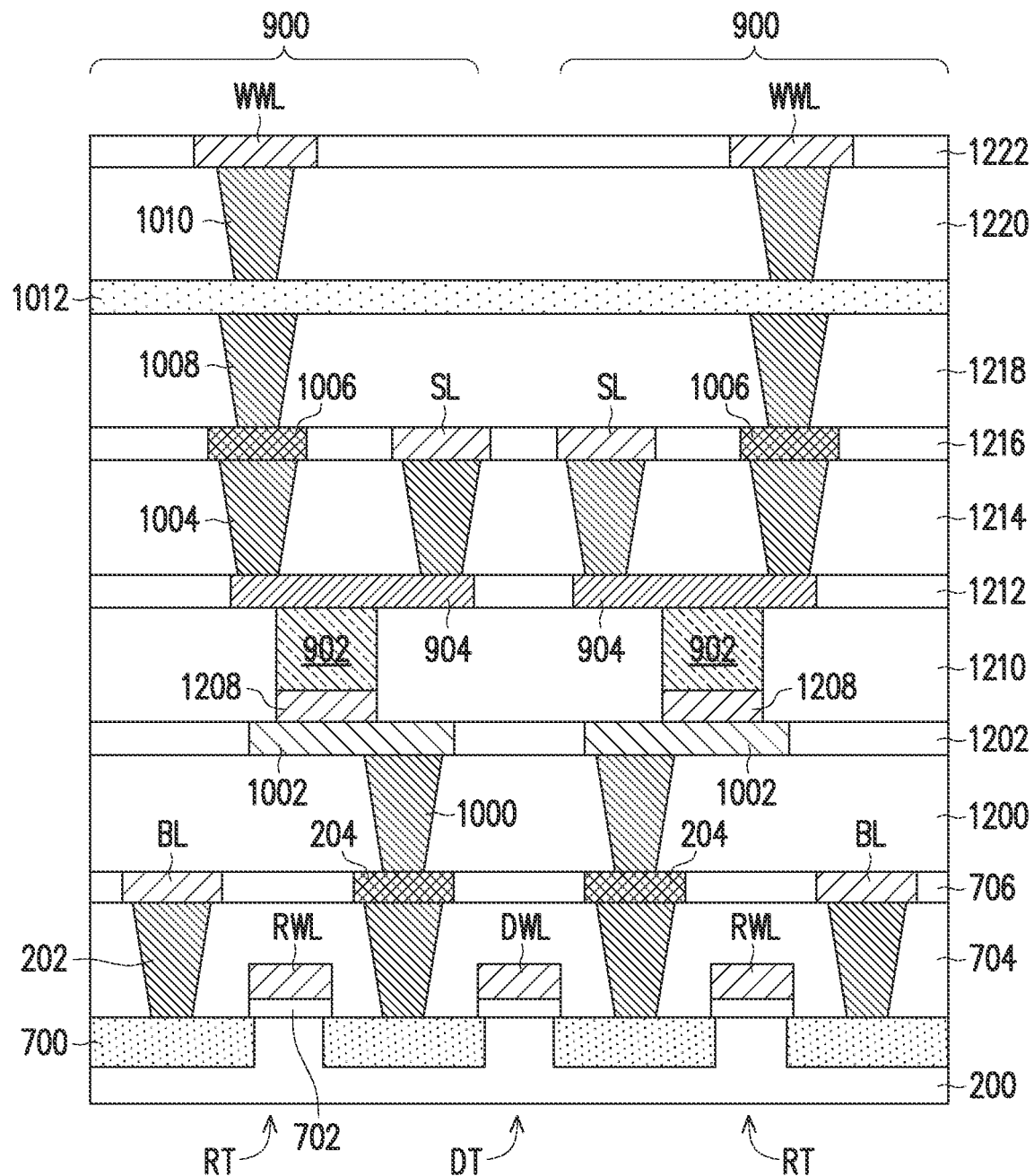

Referring to FIG. 11 and FIG. 12L, step S1122 is performed, and dielectric layers 1220, 1222 as well as the top vias 1010 of the selectors S and the write word lines WWL are formed on the switching layer 1012. The dielectric layer 1222 is stacked on the dielectric layer 1220. The top vias 1010 penetrate through the dielectric layer 1222 to reach the switching layer 1012, and may overlap the bottom vias 1008. The write word lines WWL are laterally surrounded by the dielectric layer 1222, and overlap and electrically connect to the top vias 1010.

Up to here, the unit cells 900 respectively described with reference to FIG. 10 are formed. It should be noted that, some of the elements described with reference to FIG. 12A through FIG. 12L (e.g., the dielectric layers 704, 706, 1200, 1202, 1210, 1212, 1214, 1216, 1218 and the electrodes 1208) are omitted from illustration in FIG. 10. Although the SHEs 904 and the MTJs 902 are described as being formed between second and third metallization layers from bottom of the BEOL structure BE, the SHEs 904 and the MTJs 902 may be alternatively formed between other vertically adjacent metallization layers in the BEOL structure BE, and more or fewer conductive features may be formed in the BEOL structure BE for routing the SHEs 904 and the MTJs 902. In addition, further BEOL process may be performed to form a device wafer. Moreover, the device wafer may be subjected to a packaging process to form a plurality of semiconductor packages.

It should be noted that, although a first type storage element including the MTJ 102 standing on the SHE 104 is described as being driven by a write transistor WT and a read transistor RT in the FEOL structure FE (as shown in FIG. 2), and a second type storage element including the MTJ 902 in contact with the SHE 904 from below is described as being driven by a read transistor WT in the FEOL structure FE and a selector S in the BEOL structure BE (as shown in FIG. 10), the storage element of first type may be alternatively driven by a combination of a transistor and a selector, and the storage element of second type may be alternatively driven by two transistors. Other driving schemes may also be available to the storage element of first type and the storage element of second type, and routings between the drivers and the storage element may be modified accordingly. The present disclosure is not limited to the driving scheme of the storage elements.

As above, the SOT-MRAM according to embodiments of the present disclosure employs a SHE formed of an alloy including at least one heavy metal element and at least one light transition metal element. The heavy metal element may be selected from 5d metal elements, while the light transition metal element may be selected from transition metal elements with valence electron(s) partially filling in 3d orbitals. Such SHE exhibits high spin Hall angle and low electrical resistivity. As a result of the high spin Hall angle, conversion from an in-plane charge current provided across the SHE to a perpendicular spin current induced due to spin Hall effect is extraordinarily efficient. On the other hand, as a result of the low electrical resistivity, a shunting ratio of the SHE is low, and a greater portion of the in-plane charge current may contribute to the conversion for generating the spin current. Therefore, power efficiency of a programming operation by using the spin current is effectively improved.

In an aspect of the present disclosure, a memory device is provided. The memory device comprises: a magnetic tunneling junction (MTJ), including a free layer, a reference layer and a barrier layer lying between the free layer and the reference layer; and a spin Hall electrode (SHE), in contact with the MTJ and configured to convert a charge current to a spin current for programming the MTJ, wherein the SHE is formed of an alloy comprising at least one heavy metal element and at least one light transition metal element, the heavy metal element is selected from metal elements with one or more valence electrons filling in 5d orbitals, and the light transition metal element is selected from transition metal elements with one or more valence electrons partially filling in 3d orbitals.

In another aspect of the present disclosure, a memory device is provided. The memory device comprises: a write transistor and a read transistor, formed on a surface region of a substrate; a SHE, lying over the write transistor and the read transistor, and electrically connected to a source/drain terminal of the write transistor and a source/drain terminal of the read transistor, wherein the SHE is formed of an alloy comprising at least one heavy metal element and at least one light transition metal element, the heavy metal element is selected from metal elements with one or more valence electrons filling in 5d orbitals, and the light transition metal element is selected from transition metal elements with one or more valence electrons partially filling in 3d orbitals; a MTJ, standing on the SHE, and in contact with the SHE by a first terminal; and a bit line, coupled to a second terminal of the MTJ.

In yet another aspect of the present disclosure, a memory device is provided. The memory device comprises: a read transistor, formed on a surface region of a substrate, and comprising a read word line extending on the substrate; a bit line, lying over the read word line and coupled to a source/drain terminal of the read transistor; a MTJ, disposed over the read transistor and coupled to the other source/drain terminal of the read transistor by a first terminal; a SHE, lying on the MTJ and in contact with a second terminal of the MTJ, wherein the SHE is formed of an alloy comprising at least one heavy metal element and at least one light transition metal element, the heavy metal element is selected from metal elements with one or more valence electrons filling in 5d orbitals, and the light transition metal element is selected from transition metal elements with one or more valence electrons partially filling in 3d orbitals; a selector, disposed over the SHE and coupled to the SHE by a first terminal; and a write word line, lying over the selector and coupled to a second terminal of the selector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a magnetic tunneling junction (MTJ), including a free layer, a reference layer and a barrier layer lying between the free layer and the reference layer; and
   a spin Hall electrode (SHE), in contact with the MTJ and configured to convert a charge current to a spin current for programming the MTJ, wherein the SHE is formed of an alloy comprising a heavy metal element and a transition metal element, wherein the heavy metal element is palladium (Pd) or platinum (Pt), and the transition metal element is vanadium (V).

2. The memory device according to claim 1, wherein the alloy is a palladium-vanadium alloy.

3. The memory device according to claim 1, wherein the alloy is a platinum-vanadium alloy.

4. The memory device according to claim 3, wherein the platinum-vanadium alloy is represented as $Pt_yV_{1-y}$, wherein the y ranges from 0.7 to 0.9.

5. The memory device according to claim 1, wherein a thickness of the SHE ranges from 0.5 nm to 10 nm.

6. The memory device of claim 1, wherein a width of the SHE is greater than a width of the MTJ.

7. The memory device of claim 1, further comprising a selector electrically coupled to the SHE, the selector being on a first side of the SHE, the MTJ being on the second side of the SHE.

8. The memory device of claim 1, wherein the SHE is electrically interposed between a bit line and the MTJ.

9. A memory device, comprising:
   a write transistor and a read transistor, formed on a surface region of a substrate;
   a spin Hall electrode (SHE), lying over the write transistor and the read transistor, and electrically connected to a source/drain terminal of the write transistor and a source/drain terminal of the read transistor, wherein the SHE is formed of an alloy comprising a first metal and a second metal, wherein the first metal is platinum (Pt) or palladium (Pd), and the second metal comprises vanadium (V); and
   a magnetic tunneling junction (MTJ), standing on the SHE and in contact with the SHE by a first terminal.

10. The memory device according to claim 9, wherein the alloy is $Pt_yV_{1-y}$, wherein the y ranges from 0.7 to 0.9.

11. The memory device according to claim 9, wherein a free layer of the MTJ lies in a bottom region of the MTJ.

12. The memory device according to claim 9, further comprising a passivation layer, conformally covering a sidewall and a top surface of the MTJ, as well as a top surface of the SHE.

13. The memory device according to claim 9, further comprising a diffusion barrier lying between the MTJ and the SHE, wherein the diffusion barrier is formed of a non-magnetic conductive material.

14. The memory device according to claim 9, further comprising:
   a bit line, coupled to a second terminal of the MTJ;
   a first source line, lying over the write transistor and the read transistor, and coupled to another source/drain terminal of the write transistor; and
   a second source line, lying over the write transistor and the read transistor, and coupled to another source/drain terminal of the read transistor.

15. The memory device according to claim 9, further comprising a dummy word line lying on the substrate and located between the write transistor and the read transistor.

16. A memory device, comprising:
   a read transistor on a surface region of a substrate;
   a magnetic tunneling junction (MTJ), disposed over the read transistor and coupled to a source/drain terminal of the read transistor by a first terminal;
   a spin Hall electrode (SHE), lying on the MTJ and in contact with a second terminal of the MTJ, wherein the SHE is formed of an alloy comprising a first metal element and a second metal element, wherein the first metal element is selected from the group consisting of platinum (Pt) and palladium (Pd), and the second metal element comprises vanadium (V); and
   a selector, disposed over the SHE and coupled to the SHE by a first terminal.

17. The memory device according to claim 16, wherein the alloy is $Pt_yV_{1-y}$, wherein the y ranges from 0.7 to 0.9.

18. The memory device according to claim 16, wherein a free layer in the MTJ lies in a top region of the MTJ.

19. The memory device according to claim 16, further comprising:
   a bit line coupled to another source/drain terminal of the read transistor;
   a write word line, lying over the selector and coupled to a second terminal of the selector; and
   a source line, lying over the SHE and electrically connected to the SHE.

20. The memory device according to claim 16, wherein the selector is a two-terminal switching device.

* * * * *